(12) United States Patent
Mabuchi

(10) Patent No.: US 9,667,894 B2
(45) Date of Patent: May 30, 2017

(54) SOLID STATE IMAGING ELEMENT, DRIVING METHOD OF SOLID STATE IMAGING ELEMENT, AND ELECTRONIC APPARATUS

(71) Applicant: Sony Corporation, Tokyo (JP)

(72) Inventor: Keiji Mabuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 291 days.

(21) Appl. No.: 14/387,511

(22) PCT Filed: Mar. 21, 2013

(86) PCT No.: PCT/JP2013/001938
§ 371 (c)(1),
(2) Date: Sep. 23, 2014

(87) PCT Pub. No.: WO2013/145661
PCT Pub. Date: Oct. 3, 2013

(65) Prior Publication Data
US 2015/0076323 A1  Mar. 19, 2015

(30) Foreign Application Priority Data

Mar. 30, 2012 (JP) ................................ 2012-079031

(51) Int. Cl.
*H04N 5/335* (2011.01)
*H04N 5/372* (2011.01)
(Continued)

(52) U.S. Cl.
CPC ... *H04N 5/37213* (2013.01); *H01L 27/14609* (2013.01); *H01L 27/14612* (2013.01);
(Continued)

(58) Field of Classification Search
CPC ........ H04N 5/335; H04N 5/341; H04N 5/357; H04N 5/3559
(Continued)

(56) References Cited

U.S. PATENT DOCUMENTS

| 2006/0044437 | A1 | 3/2006 | Shah | |
|---|---|---|---|---|
| 2012/0153125 | A1 | 6/2012 | Oike et al. | |
| 2012/0326010 | A1* | 12/2012 | Mabuchi | H04N 5/353 250/208.1 |

FOREIGN PATENT DOCUMENTS

| EP | 2 362 642 A1 | 8/2011 |
|---|---|---|
| JP | 2009-268083 A | 11/2009 |

OTHER PUBLICATIONS

International Search Report: International Application No. PCT/JP2013/01938; International Filing Date: Mar. 21, 2013. (Form PCT/ISA/210).
(Continued)

*Primary Examiner* — Kevin Pyo
(74) *Attorney, Agent, or Firm* — Chip Law Group

(57) ABSTRACT

A solid state imaging element including a drive circuit and a pixel unit with pixels arranged in a matrix form. The pixels include a photoelectric conversion element configured to convert light incident thereupon into a charge and to accumulate the charge, a charge holding unit connected to the photoelectric conversion element, and a floating diffusion region. The drive circuit transfers a first portion of the charge accumulated in the photoelectric conversion element to the charge holding unit and concurrently transfers a second portion of the charge accumulated in the photoelectric conversion element to the floating diffusion region. Electronic global shutter is realized by transferring charge from the photoelectric conversion elements of each of the pixels at substantially the same time.

13 Claims, 14 Drawing Sheets

(51) Int. Cl.
    *H01L 27/146*     (2006.01)
    *H04N 5/3745*     (2011.01)
    *H04N 9/04*     (2006.01)
    *H01L 27/148*     (2006.01)
    *H04N 5/378*     (2011.01)
    *H04N 5/347*     (2011.01)

(52) U.S. Cl.
    CPC .. *H01L 27/14654* (2013.01); *H01L 27/14831* (2013.01); *H04N 5/378* (2013.01); *H04N 5/37452* (2013.01); *H04N 9/045* (2013.01); *H04N 5/347* (2013.01); *H04N 5/37457* (2013.01)

(58) Field of Classification Search
    USPC .................. 250/208.1, 214.1; 348/296, 302
    See application file for complete search history.

(56) References Cited

OTHER PUBLICATIONS

Written Opinion of the International Searching Authority: International Application No. PCT/JP2013/01938; Date of Mailing: Jul. 8, 2013. (Form PCT/ISA/220 and PCT/ISA/237).

\* cited by examiner

SOLID STATE IMAGING ELEMENT, DRIVING METHOD OF SOLID STATE IMAGING ELEMENT, AND ELECTRONIC APPARATUS

TECHNICAL FIELD

The present disclosure related to a solid state imaging element, a driving method of a solid state imaging element, and electronic apparatuses, and in particular, to a solid state imaging element, a driving method of a solid state imaging element, and electronic apparatuses capable of imaging a better image.

BACKGROUND ART

In the related art, solid state imaging elements such as a CMOS (Complementary Metal Oxide Semiconductor) image sensor, and a CCD (Charge Coupled Device) image sensor are widely used in digital still cameras, digital video cameras, or the like. In addition, in recent years, CMOS image sensors are often adopted for solid state imaging elements installed in mobile apparatuses such as mobile phone apparatuses provided with an imaging function, from the viewpoint that the power supply voltage is low and the power consumption is low.

For example, in the CMOS image sensor, the charge, which is photoelectrically converted by the PD (Photodiode) included in a pixel, is transferred to the FD (Floating Diffusion) which is a floating diffusion region. Furthermore, by measuring the potential of the FD, a pixel signal of a level corresponding to the charge generated by the PD is read out.

Generally, the CMOS image sensor may only perform read-out of the pixel signal for one row of pixels at a time, therefore, it is not possible to provide synchronicity of the exposure time of the screen. In relation to this, for example, according to a technology of reading out a pixel signal known as "global shutter", a CMOS image sensor provided with synchronicity of exposure time of the screen is being developed. In the related art, in order to realize the global shutter, it is necessary to provide a shielded charge holding region in the pixels, and to hold the pixel signal in the charge holding region in pixels which are waiting for read-out of the pixel signal. As this charge holding region, an FD provided in a pixel is often used.

In addition, the present applicant proposes a solid state imaging element which avoids a reduction in saturation charge amount by using both a CCD-type memory section and an FD as the charge holding region (for example, refer to PTL 1).

CITATION LIST

Patent Literature

PTL 1: Japanese Unexamined Patent Application Publication No. 2009-268083

SUMMARY OF INVENTION

Technical Problem

Incidentally, in recent years, although miniaturization of solid state imaging elements is progressing, there is a demand for further improvement in sensitivity, an increase in the saturation charge amount, and the like, and development of technology which can perform imaging of better images, even in miniature solid state imaging elements, is anticipated.

The present disclosure is made in consideration of such a situation, and makes it possible to perform imaging of better images.

Solution to Problem

According to an aspect of an exemplary embodiment of the present disclosure, there may be provided a solid state imaging element, comprising a drive circuit and a pixel unit including pixels arranged in a matrix form. A given one of the pixels may include a photoelectric conversion element configured to convert light incident thereupon into a charge and to accumulate the charge, a charge holding unit connected to the photoelectric conversion element, and a floating diffusion region. Furthermore, the drive circuit may be configured to perform a transfer operation for the given one of the pixels comprising causing the charge holding unit to receive and hold a first portion of the charge accumulated in the photoelectric conversion element and concurrently causing the floating diffusion region to receive and hold a second portion of the charge accumulated in the photoelectric conversion element. The above described exemplary embodiment allows for the charge holding unit to be miniaturized without reducing the amount of charge that can be held by a pixel. Because of the miniaturization of the charge holding unit, a pixel size may be decreased and more pixels may be included in an imaging element of the same size, or a pixel size may remain the same and the area of the photoelectric conversion element may be widened, increasing the saturation charge amount of the photoelectric conversion element.

According to another aspect of the above-described exemplary embodiment, the drive circuit may be configured to, after performing the transfer operation, read out a data signal corresponding to the magnitude of the second portion of the charge accumulated in the photoelectric conversion element and subsequently to read out a data signal corresponding to the magnitude of the first portion of the charge accumulated in the photoelectric conversion element.

According to another aspect of the above-described exemplary embodiment, the drive circuit may be configured to, after reading out the data signal corresponding to the magnitude of the second portion of the charge accumulated in the photoelectric conversion element and before reading out the data signal corresponding to the magnitude of the first portion of the charge accumulated in the photoelectric conversion element: reset the floating diffusion region, read out a data signal corresponding to a reset level of the floating diffusion region, and perform a secondary transfer operation comprising causing the first portion of the charge accumulated in the photoelectric conversion element, which is held in the charge holding unit, to be transferred to the floating diffusion region.

According to another aspect of the above-described exemplary embodiment, the given one of the pixels may further comprise a reset transistor connected to the floating diffusion region and to a reset potential and that is configured to conduct when a reset signal is applied thereto, and a selection transistor configured to, when a selection signal is applied thereto, output a data signal to the drive circuit, the data signal being based on the magnitude of a charge held in the floating diffusion region. Furthermore, the drive circuit may be configured to: read out the data signal corresponding to the magnitude of the second portion of the charge accumulated in the photoelectric conversion element by applying the selection signal to the selection transistor when the second portion of the charge accumulated in the photoelectric conversion element is held in the floating diffusion region, reset the floating diffusion region by applying the reset signal to the reset transistor, read out the data signal corresponding to a reset level of the floating diffusion region by applying the selection signal to the selection transistor after resetting the floating diffusion region, and read out the data signal corresponding to the magnitude of the first portion of the charge accumulated in the photoelectric conversion element by applying the selection signal to the selection transistor when the first portion of the charge accumulated in the photoelectric conversion element is held in the floating diffusion region.

According to another aspect of the above-described exemplary embodiment each of the pixels may include a photoelectric conversion element configured to convert light incident thereupon into a charge and to accumulate the charge. Furthermore, the drive circuit may be configured to perform a global shutter operation comprising: beginning respective charge accumulation periods for each of the pixels at substantially the same time by resetting the photoelectric conversion element of each of the pixels at substantially the same time, and ending the respective accumulation periods for each of the pixels at substantially the same time.

According to another aspect of the above-described exemplary embodiment, each of the pixels may include a charge holding unit connected to the photoelectric conversion element thereof, and a floating diffusion region. Furthermore, the drive circuit may be configured to end the respective accumulation periods for the pixels at substantially the same time by performing the transfer operation for each of the pixels at substantially the same time According to another aspect of the above-described exemplary embodiment, the drive circuit may be configured to perform a rolling readout operation comprising reading out, from each of the pixels, respective data signals corresponding to the respective charges accumulated in the photoelectric conversion elements of the pixels. Furthermore, the drive circuit may be configured to start the global shutter operation for an (n+1)-th imaging frame while the rolling readout operation for an n-th imaging frame is being performed.

According to another aspect of the above-described exemplary embodiment, the given one of the pixels may include a drain transistor connected to the photoelectric conversion element and to a drain potential. The drive circuit may be configured to reset the photoelectric conversion element by causing the drain transistor to be in a conducting state for a pulsed period. Furthermore, the magnitude of a potential barrier between the drain transistor when in a non-conducting state and the photoelectric conversion element may be smaller than the magnitude of a potential barrier between the charge holding unit and the photoelectric conversion element.

According to another aspect of the above-described exemplary embodiment, each of the pixels may include: a photoelectric conversion element configured to convert light incident thereupon into a charge and to accumulate the charge, a charge holding unit connected to the photoelectric conversion element thereof, and a floating diffusion region. Furthermore, the pixels may be arranged in groups of N≥2 pixels, where N is an integer, such that those pixels that are included in a same one of the groups share one floating diffusion region in common, the one floating diffusion region constituting the respective floating diffusion regions included in each of those pixels that share the one floating diffusion in common.

According to another aspect of the above-described exemplary embodiment, the drive circuit may be configured to end the respective accumulation periods for the pixels at substantially the same time by driving a mechanical shutter.

According to another aspect of the above-described exemplary embodiment, a charge holding capacity of the charge holding unit may be less than a charge holding capacity of the photoelectric conversion element.

According to another aspect of the above-described exemplary embodiment, the solid state imaging element may be included in an electronic imaging apparatus.

According to an aspect of another exemplary embodiment of the present disclosure, a method of operating a solid state imaging element that may include pixels arranged in a matrix form, wherein a given one of the pixels may include a photoelectric conversion element configured to convert light incident thereupon into a charge and to accumulate the charge, a charge holding unit connected to the photoelectric conversion element, and a floating diffusion region, may be performed. The method may include performing a transfer operation for the given one of the pixels of causing the charge holding unit to receive and hold a first portion of the charge accumulated in the photoelectric conversion element and concurrently causing the floating diffusion region to receive and hold a second portion of the charge accumulated in the photoelectric conversion element.

According to another aspect of the above-described exemplary embodiment, the method may further include, after performing the transfer operation for the given one of the pixels, successively: reading out a data signal corresponding to the magnitude of the second portion of the charge accumulated in the photoelectric conversion element; resetting the floating diffusion region; reading out a data signal corresponding to a reset level of the floating diffusion region; performing a secondary transfer operation comprising causing the first portion of the charge accumulated in the photoelectric conversion element that is held in the charge holding unit to be transferred to the floating diffusion region; and reading out a data signal corresponding to the magnitude of the first portion of the charge accumulated in the photoelectric conversion element.

According to another aspect of the above-described exemplary embodiment, each of the pixels may include a photoelectric conversion element configured to convert light incident thereupon into a charge and to accumulate the charge, and the method may further include performing a global shutter operation comprising: beginning respective charge accumulation periods for each of the pixels at substantially the same time by resetting the photoelectric conversion element of each of the pixels at substantially the same time, and ending the respective accumulation periods for each of the pixels at substantially the same time.

According to another aspect of the above-described exemplary embodiment, each of the pixels may include a floating diffusion region and a charge holding unit connected to the photoelectric conversion element thereof. Furthermore, the method may further comprise: ending the respective accumulation periods for the pixels at substantially the same time by performing the transfer operation for each of the pixels at substantially the same time.

According to another aspect of the above-described exemplary embodiment, the method may further comprise: performing a rolling readout operation comprising reading out, from each of the pixels, respective data signals corresponding to the respective charges accumulated in the photoelectric conversion elements of the pixels, and starting the global shutter operation for an (n+1)-th imaging frame while the rolling readout operation for an n-th imaging frame is being performed.

Advantageous Effects of Invention

According to an aspect of the present disclosure, it is possible to perform imaging of better images.

BRIEF DESCRIPTION OF DRAWINGS

FIG. 10 is a block diagram of an imaging device which has a solid state imaging element, in which a pixel common structure is adopted, built in.

DESCRIPTION OF EMBODIMENTS

Hereafter, detailed description will be given of specific exemplary embodiments for applying the present technology with reference to the drawings.

Figure 1:
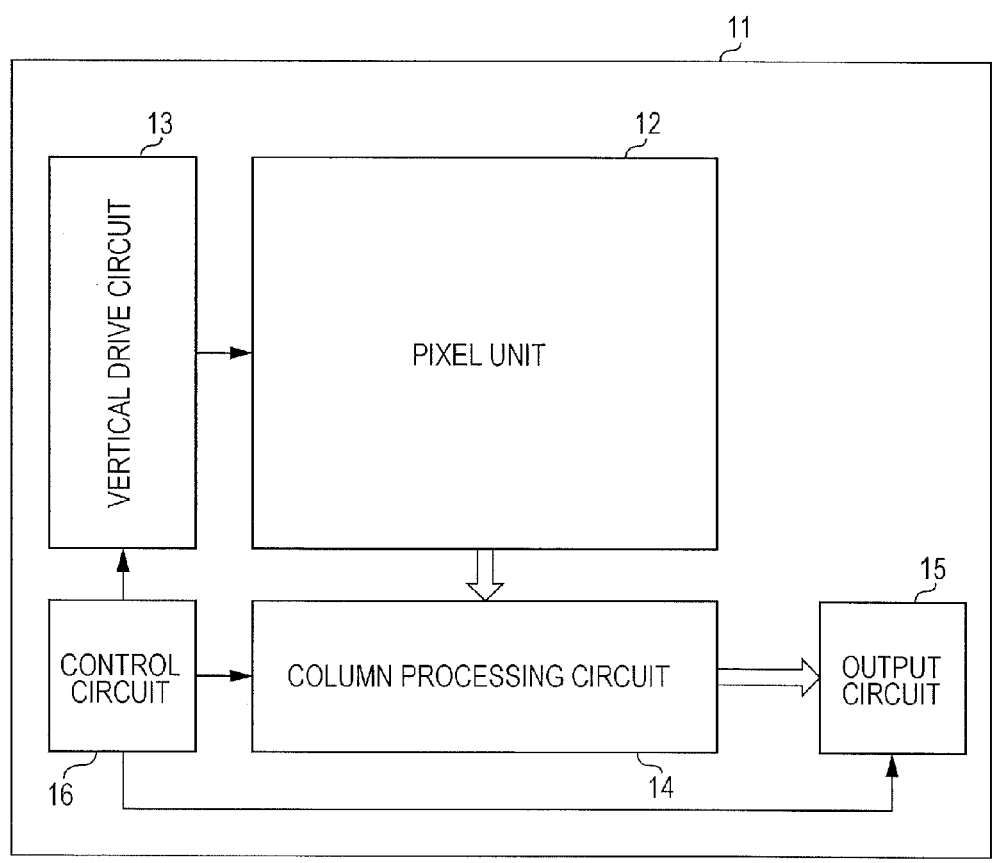
FIG. 1 is a block diagram showing a configuration example of an embodiment of the solid state imaging element to which the present technology was applied.

FIG. 1 is a block diagram showing a configuration example of an embodiment of the solid state imaging element to which the present technology was applied.

In FIG. 1, solid state imaging element 11 is configured to include a pixel unit 12, a vertical drive circuit 13, a column processing circuit 14, an output circuit 15, and a control circuit 16.

In the pixel unit 12, a plurality of pixels (pixel 21 of FIG. 2) are arranged in a matrix, and the respective pixels are connected to the vertical drive circuit 13 for every row via a horizontal signal line (not shown), as well as to the column processing circuit 14 for each column via a vertical signal line (not shown).

The vertical drive circuit 13 supplies a drive signal (for example, a reset signal Rst, a transfer signal CCD, a transfer signal Trf, a selection signal Sel, and a drain signal Drn, which are described below) for driving a pixel for each row of a plurality of pixels arranged in the pixel unit 12 in order, and drives the respective pixels.

The column processing circuit 14 receives a pixel signal of a reset level of a pixel from a plurality of pixels arranged in pixel unit 12 for each column of respective pixels, and a pixel signal of a level corresponding to the charge generated by pixels receiving light. Furthermore, the column processing circuit 14 obtains the difference between the pixel signal of a reset level and the pixel signal of a level corresponding to the generated charge, and sequentially outputs an AD converted pixel signal showing the difference value for each column of pixels.

Figure 10:
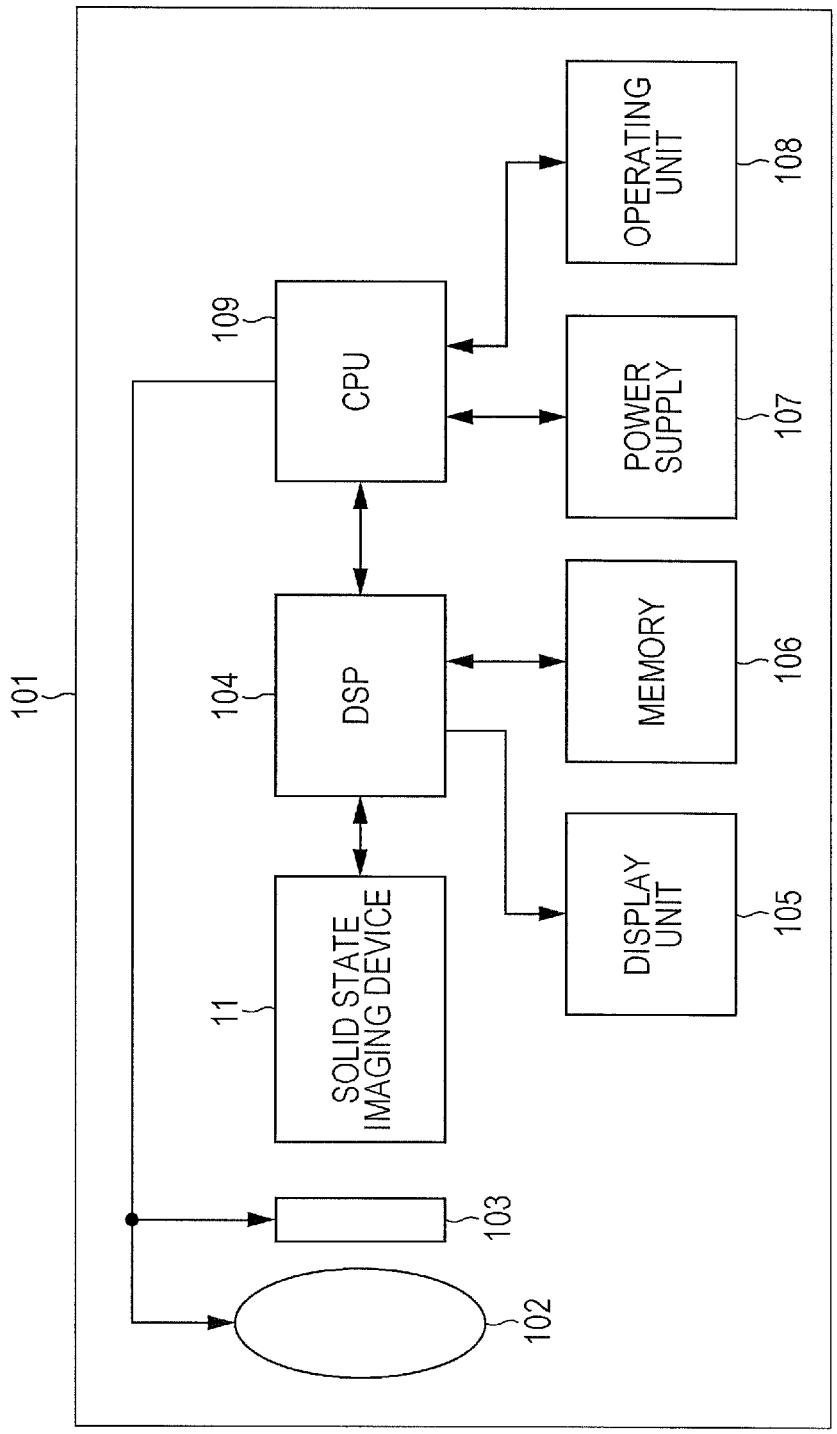

The output circuit 15 performs processing such as gain adjustment and defect correction in relation to the image signal sequentially output from the column processing circuit 14, and outputs this to an external circuit (not shown, for example, DSP 104 of FIG. 10).

The control circuit 16 supplies a control signal to each block which configures the solid state imaging element 11 and controls the operation of the solid state imaging element 11.

Figure 2:
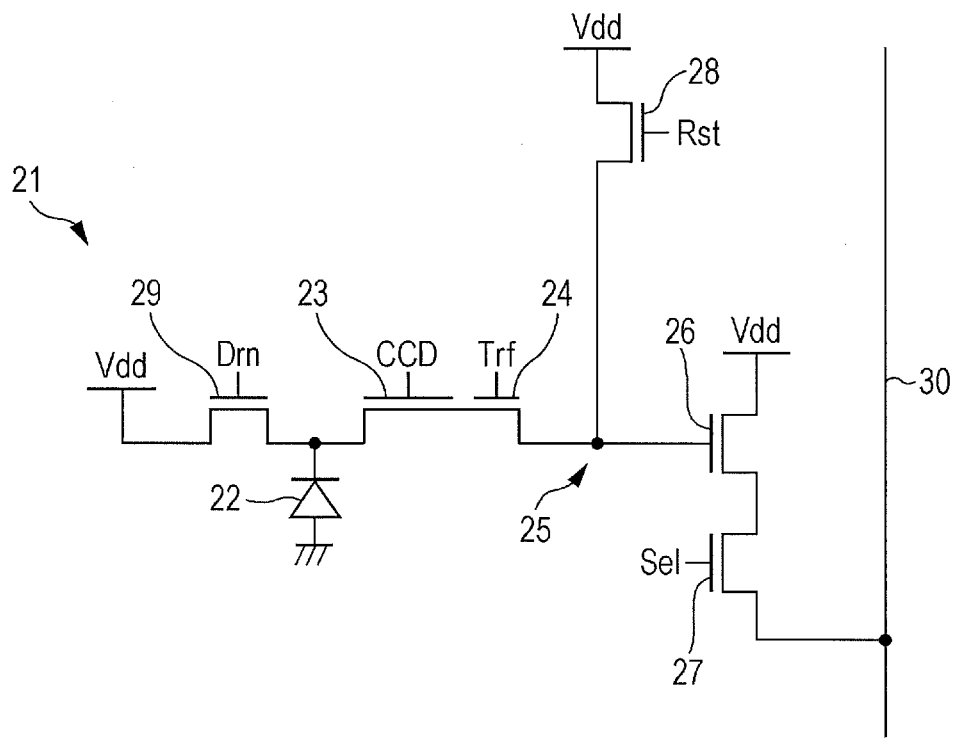
FIG. 2 is a circuit diagram of a pixel included in the pixel unit.

FIG. 2 is a circuit diagram of a pixel included in the pixel unit 12.

As shown in FIG. 2, the pixel 21 is configured to include a PD 22, a charge holding unit 23, a transfer transistor 24, a FD 25, an amplification transistor 26, a selection transistor 27, a reset transistor 28, and a drain transistor 29. In addition, a vertical signal line 30, which transfers the pixel signal output from the pixel 21 to the column processing circuit 14, is connected to the pixel 21.

The PD 22 is a photoelectric conversion unit which converts incident light into a charge (electrons or holes) using photoelectric conversion, and accumulates it. In addition, in the PD 22, an anode terminal is grounded, and, a cathode terminal is connected to the FD 25 via the charge holding unit 23 and the transfer transistor 24.

The charge holding unit 23 is configured by a Charged Coupled Device (CCD) having a function of holding a charge. The charge holding unit 23 is driven according to the transfer signal CCD supplied from the vertical drive circuit 13, and when the transfer signal CCD is at a High level, the charge accumulated in the PD 22 is transferred to the charge holding unit 23 and held.

The transfer transistor 24 is driven according to the transfer signal Trf supplied from the vertical drive circuit 13, and when the transfer transistor 24 is on, the charge held in the charge holding unit 23 is transferred to the FD 25 via the transfer transistor 24.

The FD 25 is a floating diffusion region having a predetermined accumulation capacity connected to a gate electrode of the amplification transistor 26, and accumulates the charge transferred via the charge holding unit 23 and the transfer transistor 24. In addition, when the charge generated by the PD 22 is greater than the capacity of the charge holding unit 23, a portion of the charge transferred from the PD 22 to the charge holding unit 23 overflows the transfer transistor 24 and is accumulated in the FD 25.

The amplification transistor 26 outputs a pixel signal of a level corresponding to the charge accumulated in FD 25 (in other words, the potential of FD 25) to the vertical signal line 30 via the selection transistor 27. In other words, by being of a configuration in which the FD 25 is connected to the gate electrode of the amplification transistor 26, the FD 25 and the amplification transistor 26 convert the charge generated by the PD 22 into a pixel signal of a level corresponding to the charge.

The selection transistor 27 is driven according to the selection signal Sel supplied from the vertical drive circuit 13, and when the selection transistor 27 is on, the pixel signal output from the amplification transistor 26 enters a state in which it may be output to the vertical signal line 30.

The reset transistor 28 is driven according to the reset signal Rst supplied from the vertical drive circuit 13, and when the reset transistor 28 is on, the charge accumulated in the FD 25 is drained to the power supply wiring Vdd, and the FD 25 is reset.

The drain transistor 29 is driven according to the drain signal Drn supplied from the vertical drive circuit 13, and when the drain transistor 29 is on, the charge collected in the PD 22 is drained to the power supply wiring Vdd, and the PD 22 is reset.

Furthermore, in the present embodiment, the transfer transistor 24, an amplification transistor 26, the selection transistor 27, the reset transistor 28, and the drain transistor 29 which configure the pixel 21 are NMOS (Negative Channel Metal Oxide semiconductor)-type transistors. Therefore, the charge handled by the pixel 21 is electrons. In addition, the charge holding unit 23 and the FD 25 are shielded by the wiring layer and the like.

Next, the driving of the solid state imaging element 11 will be described with reference to FIG. 3.

Figure 3:
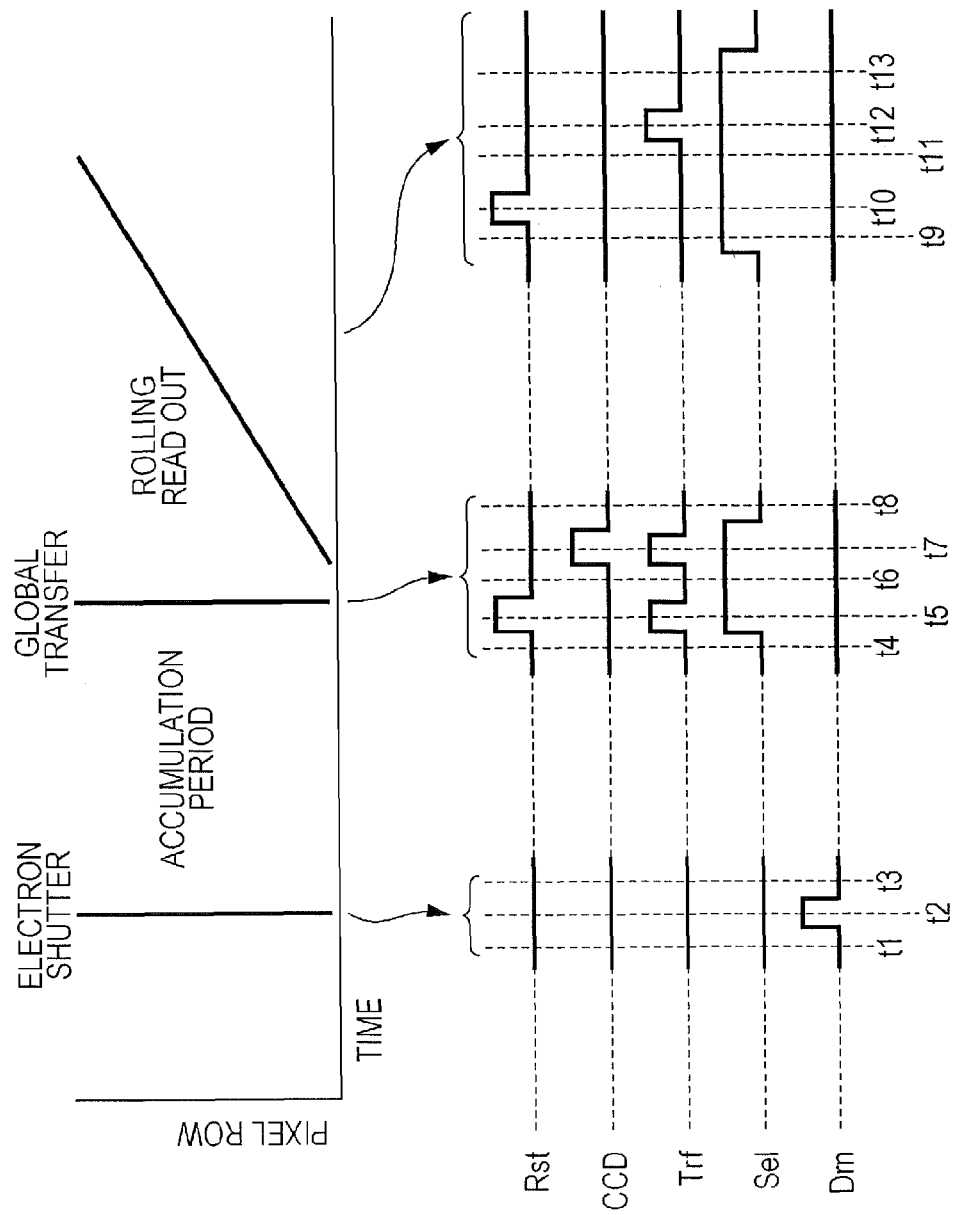
FIG. 3 is a view illustrating the driving of the solid state imaging element.

In the upper side of FIG. 3, the driving timing of each row of pixels 21 is shown, the vertical axis shows a row of pixels 21, and the horizontal axis shows time. In addition, in the lower side of FIG. 3, a timing chart is shown of the reset signal Rst, the transfer signal CCD, the transfer signal Trf, the selection signal Sel, and the drain signal Drn.

First, in the solid state imaging element 11, the electronic shutters operate at the same time in all of the rows of the pixels 21 included in the pixel unit 12, the charge accumulated in the PD 22 is drained, and an accumulation period, in which the charge is accumulated in the PD 22, is started. In other words, at the same time in all of the rows of the pixels 21 included in the pixel unit 12, the drain signal Drn is on and the charge accumulated in the PD 22 is drained to the power supply wiring Vdd, and the charge starts being accumulated in the PD 22 from a timing that the drain signal Drn becomes off.

Next, in the solid state imaging element 11, the charge accumulation period ends at the same time in all of the rows of the pixels 21 included in the pixel unit 12, and global transfer is performed. In other words, at the timing when the selection signal Sel becomes on, the reset signal Rst and the transfer signal Trf become on in a pulse-shape, and the charge holding unit 23 and the FD 25 are reset. Subsequently, the transfer signal CCD and the transfer signal Trf become on in a pulse-shape, and the charge generated by the PD 22 during the charge accumulation period is transferred to the charge holding unit 23 and the FD 25, after which the selection signal Sel becomes off. Here, the charge transferred to the FD 25 overflows the charge holding unit 23 and is transferred when the charge generated by the PD 22 is great.

In this manner, in the solid state imaging element 11, a global shutter is realized by the fact that the accumulation period is started at the same time (at the same timing) in all of the pixels 21, and, as expected, the charge accumulated in the PD 22 during the accumulation period is transferred at the same time.

Furthermore, in the solid state imaging element 11, read-out of the pixel signal of a reset level and the pixel signal of a level corresponding to the charge generated by the PD 22 (hereinafter appropriately referred to as the rolling read-out) is performed sequentially for each row of the pixels 21 included in the pixel unit 12. Here, in the solid state imaging element 11, as the pixel signal of a level corresponding to the charge generated by the PD 22, the pixel signal of a level corresponding to the charge transferred to the charge holding unit 23 in the global transfer, and the pixel signal of a level corresponding to the charge which overflows the charge holding unit 23 in the global transfer are transferred to the FD 25 and read out.

In other words, the selection signal Sel is on, a pixel signal of a level corresponding to the charge transferred to the FD 25 in the global transfer is read out, and after the reset signal Rst becomes on in a pulse-shape and the FD 25 is reset, the pixel signal of a reset level is read out. Furthermore, after the transfer signal Trf becomes on in a pulse-shape and the charge accumulated in the charge holding unit 23 is transferred to the FD 25, a pixel signal of a level corresponding to the charge transferred to the charge holding unit 23 in the global transfer is read out. Subsequently, the selection signal Sel becomes off.

Next, a change of the potential between the timing t1 and t13 shown in the timing chart of FIG. 3 will be described with reference to the potential diagrams shown in FIG. 4 to FIG. 7. Furthermore, as described above, the charge handled by the pixel 21 is electrons, therefore, in FIG. 4 to FIG. 7, the potential is shown such that the orientation in which the potential is positive is downward. In addition, the charge holding unit 23 is of a structure in which a potential barrier is provided in the PD 22 side.

Figure 4:
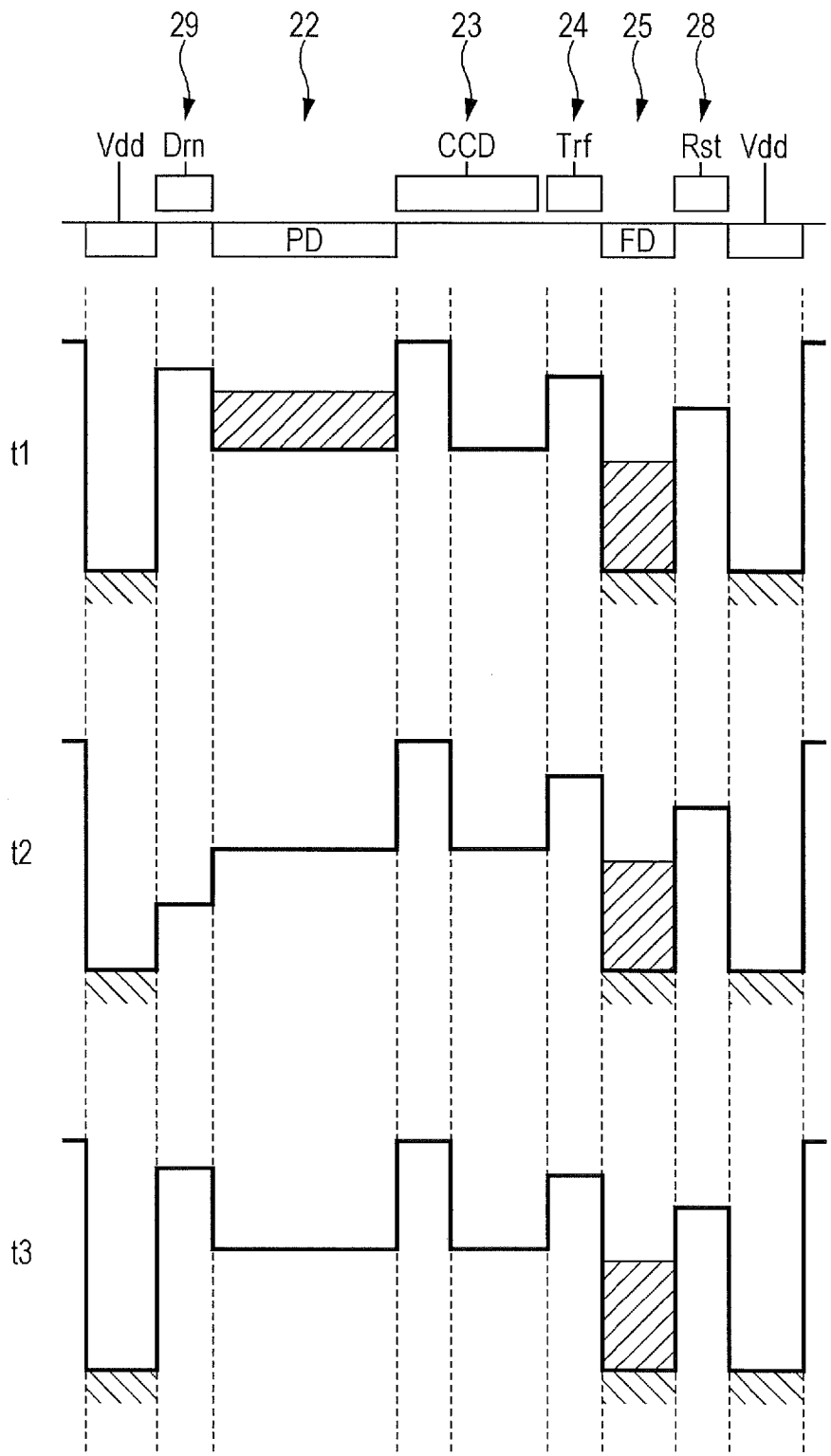
FIG. 4 is a view showing the potential between timing t1 and t3 of the timing chart of FIG. 3.

As shown in FIG. 4, at the previous timing t1 where the drain signal Drn is on before the electronic shutter is driven, a charge is collected in the PD 22 and the FD 25. The charge collected in the PD 22 is generated by an incidence of light to the pixels 21 after the global transfer in the previous frame, and the charge collected in the FD 25 is transferred to the FD 25 by a rolling read-out in the previous frame.

Furthermore, in the timing t2 where the drain signal Drn is on in a pulse-shape, the charge collected in the PD 22 is drained to the power supply wiring Vdd via the drain transistor 29.

Subsequently, from the timing t3 where the drain signal Drn is off, the charge generated by light incident to the pixels 21 being photoelectrically converted starts to be accumulated in the PD 22 which was reset and in which the charge is vacant.

Figure 5:
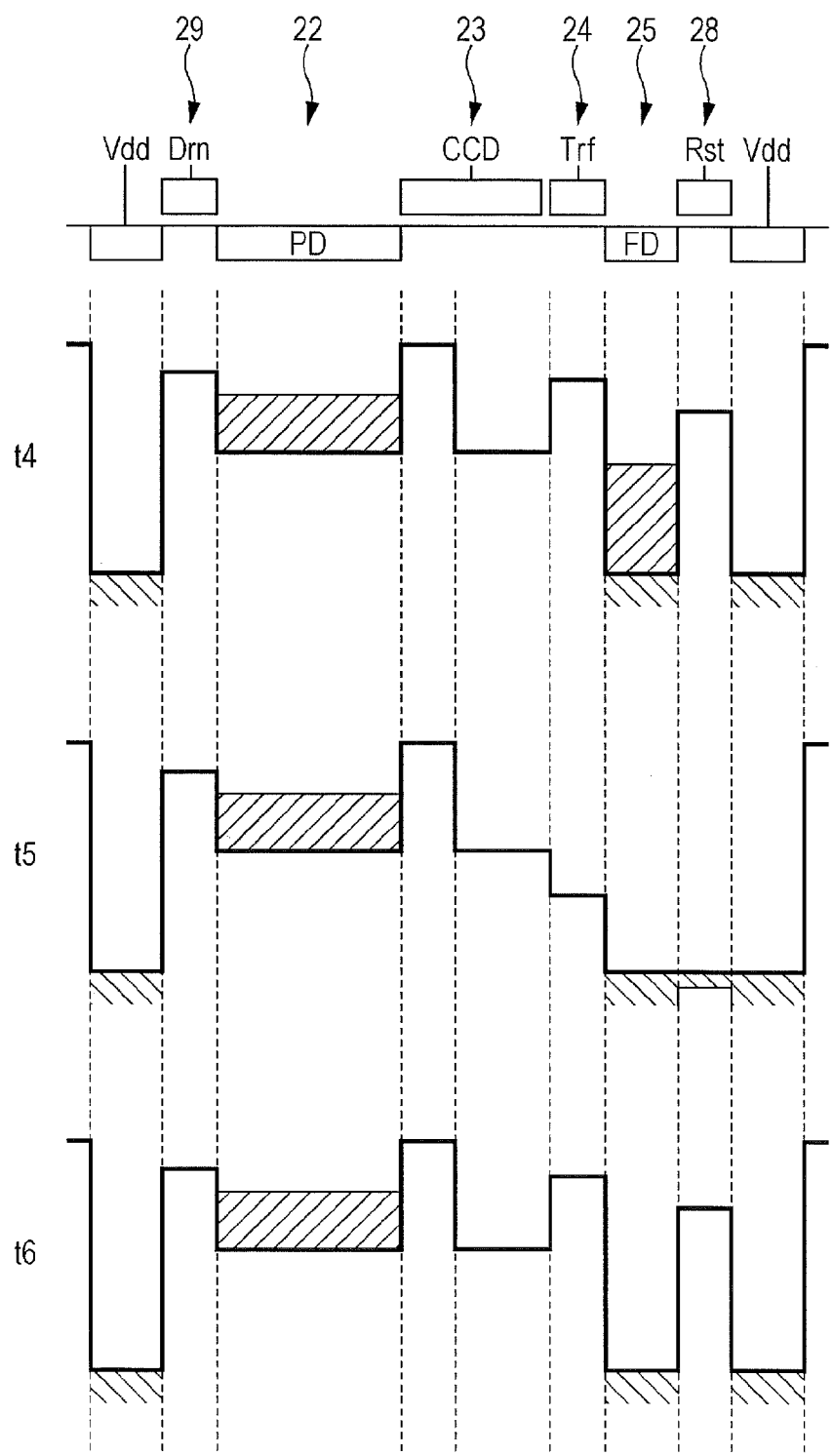
FIG. 5 is a view showing the potential between timing t4 and t6 of the timing chart of FIG. 3.

Next, as shown in FIG. 5, in the timing t4 just before the accumulation period elapses, the charge generated by photoelectric conversion is accumulated in the PD 22. Here, the quantity of light incident to the pixels 21 is great, and when a charge of the capacity of the PD 22 or more is generated, the potential barrier of the drain transistor 29 side is set to be lower than the potential barrier of the charge holding unit 23 side such that a charge overflows into the power supply wiring Vdd via the drain transistor 29. Accordingly, charge overflowing into the charge holding unit 23 is avoided.

Furthermore, in the timing t5 where the reset signal Rst and the transfer signal Trf become on in a pulse-shape, the charge collected in the charge holding unit 23 and the FD 25 is drained to the power supply wiring Vdd. At this time, as shown in FIG. 3, in order to approach a subsequent rolling read-out state, it is desirable for the selection transistor 27 to be maintained in an on state.

Subsequently, in the timing t6 where the reset signal Rst and the transfer signal Trf are off, the charge holding unit 23 and the FD 25 enter a completed state.

Figure 6:
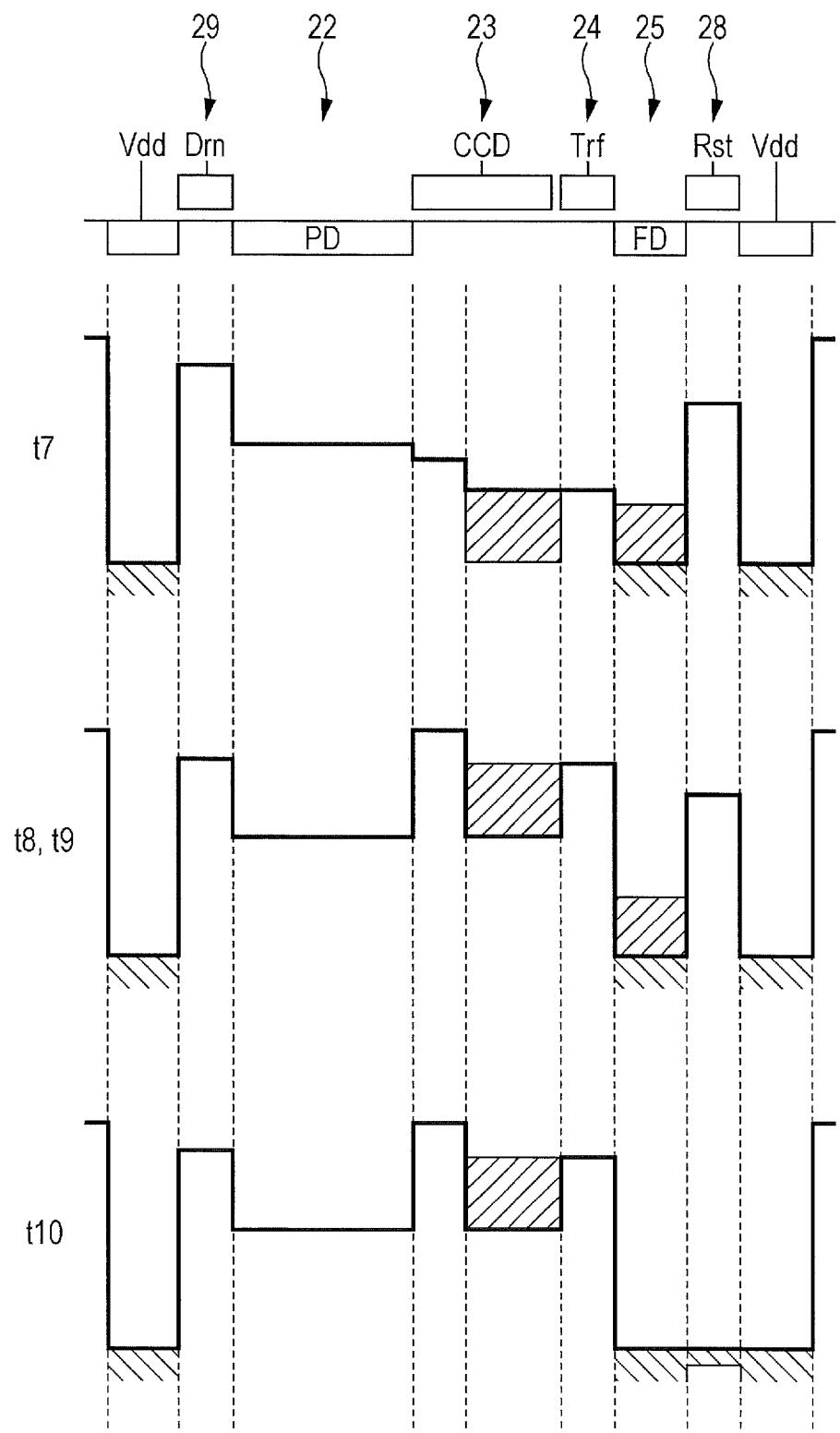
FIG. 6 is a view showing the potential between timing t7 and t10 of the timing chart of FIG. 3.

Next, as shown in FIG. 6, in the timing t7 where the transfer signal CCD and the transfer signal Trf become on in a pulse-shape, the charge accumulated in the PD 22 is transferred to the charge holding unit 23 and the FD 25. Here, the capacity of the charge holding unit 23 is not set to be able to receive the saturation charge of the PD 22. Accordingly, when the solid state imaging element 11 is irradiated with light of a high illumination and the charge generated by the PD 22 is great, the charge transferred from the PD 22 overflows from the charge holding unit 23 via the transfer transistor 24 and is transferred to the FD 25.

Furthermore, in the timing t8 where the transfer signal CCD and the transfer signal Trf are off and the global transfer is completed, the charge generated by the PD 22 is in a state of being accumulated in the charge holding unit 23 and the FD 25. Subsequently, in the solid state imaging element 11, the rolling read-out, in which a pixel signal is read out in order for each row of the pixels 21, is performed, and until becoming a target for the pixel signal read-out, the pixels 21 are maintained in a potential state of the timing t8 where the global transfer is completed.

In the pixels 21 which are a target for pixel signal read-out, the selection signal Sel becomes on, and output of the pixel signal begins. Furthermore, in the timing t9 where the pixels 21 remain in a potential state in which the global transfer is complete, a pixel signal of a level corresponding to the charge accumulated in the FD 25 is read out to the column processing circuit 14 as a pixel signal of a high illumination. Furthermore, in order to simplify description, drawings of the charge generated by the PD 22 in the period where the pixels 21 are a target for pixel signal read-out have been omitted.

Furthermore, in the timing t10 where the reset signal Rst becomes on in a pulse-shape, the charge accumulated in the FD 25 is drained to the power supply wiring Vdd.

Figure 7:
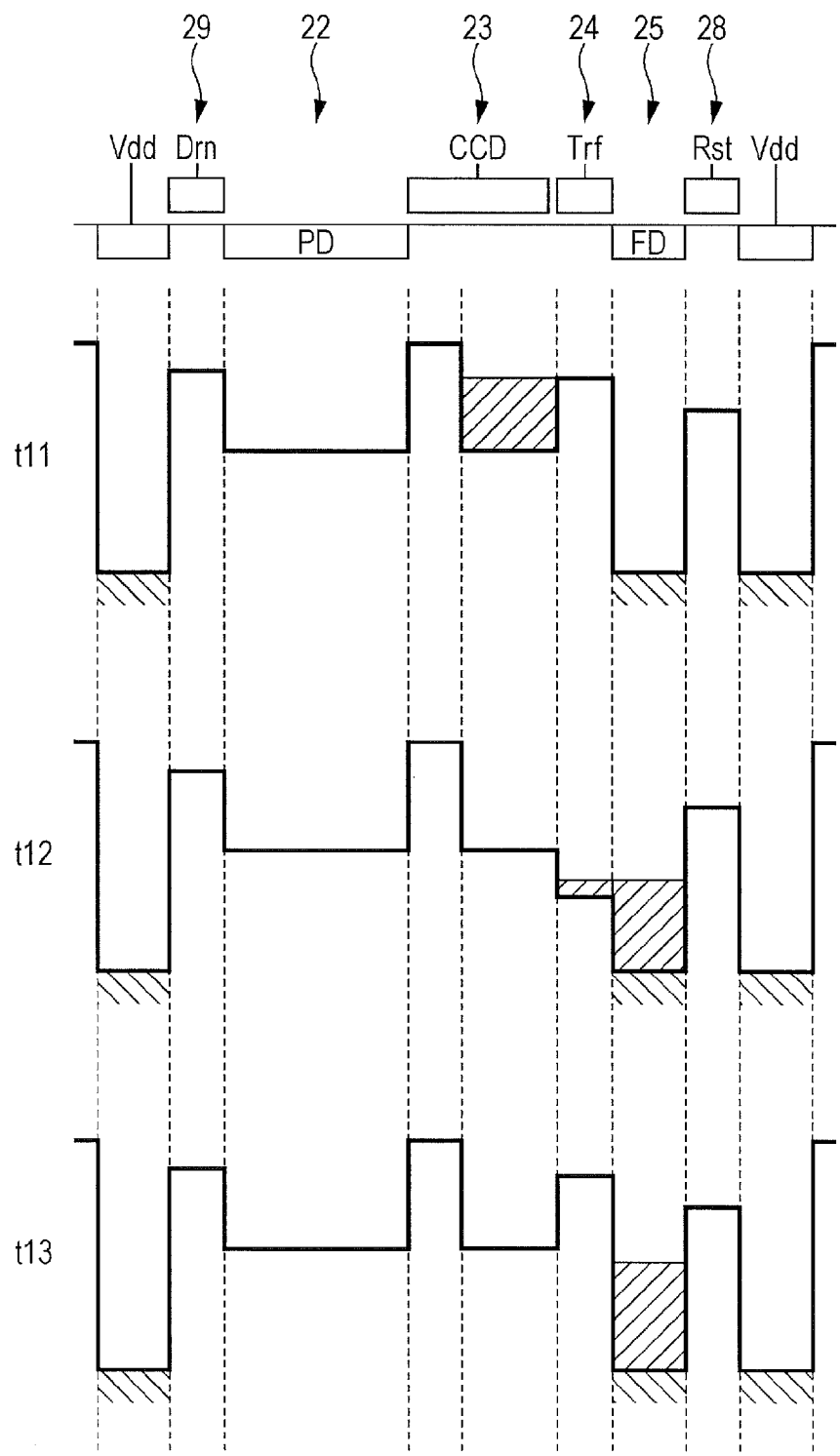
FIG. 7 is a view showing the potential between timing t11 and t13 of the timing chart of FIG. 3.

Next, as shown in FIG. 7, in the timing t11 where the reset signal Rst is off, the pixel signal of a reset level, in a state in which the FD 25 reset is complete, is read out to the column processing circuit 14. Accordingly, the column processing circuit 14 obtains the difference between the pixel signal of a high illumination which was read out at the timing t9, and the pixel signal of a reset level which was read out at the timing t11, and holds the difference as a new pixel signal of a high illumination.

Furthermore, in the timing t12 where the transfer signal Trf becomes on in a pulse-shape, the charge held in the charge holding unit 23 is transferred from the charge holding unit 23 to the FD 25.

Subsequently, in the timing t13 where the transfer signal Trf is off, a pixel signal of a level corresponding to the charge accumulated in the FD 25 is read out to the column processing circuit 14 as a pixel signal of a low illumination. Accordingly, the column processing circuit 14 obtains the difference between the pixel signal of a reset level which was read out at the timing t11, and the pixel signal of a low illumination which was read out at the timing t13, and holds the difference as a new pixel signal of a low illumination.

In this manner, in the solid state imaging element 11, the pixel signal of a high illumination and the pixel signal of a low illumination are acquired, and the column processing circuit 14 supplies the pixel signals to the output circuit 15 and performs an operation in relation to the pixels 21 of the next column. The output circuit 15 reconstructs a pixel signal corresponding to the charge accumulated in the PD 22 from the pixel signal of a high illumination and the pixel signal of a low illumination, and outputs it to the circuit of a later stage (not shown).

As described above, in the solid state imaging element 11, the accumulation of the charge generated during the accumulation period is performed only by the PD 22, the charge is transferred to the charge holding unit 23 and the FD 25 by the global transfer, and may be held until the turn to perform rolling read-out thereof comes around. In this manner, the charge holding unit 23 may be miniaturized by accumulating the charge accumulated in the PD 22, not only in the charge holding unit 23, but also in the FD 25. Accordingly, the area of the PD 22 may be widened, the sensitivity of the PD 22 may be improved, and the saturation charge amount of the PD 22 may be increased.

Therefore, even if the solid state imaging element 11 is miniaturized, a better image with a higher sensitivity and a wide dynamic range may be acquired.

Here, for example, in the technology of a global shutter of the related art, when only an FD was used as the charge holding region, there were cases in which noise was conspicuous at low illumination due to the noise generated by the FD being great. In addition, when only a CCD-type memory unit was used as the charge holding region, there were cases in which the sensitivity and the saturation charge amount of the PD greatly decrease, corresponding to a large CCD-type memory unit becoming necessary. Furthermore, in a configuration in which a CCD-type memory unit and an FD are both used as a charge holding region (refer to the above described PTL 1), when a moving image is imaged, not only did time-skipping, in which exposure could not be performed between frames, occur, but there were also cases in which the sensitivity of the moving image decreased. In contrast to this, in the solid state imaging element 11, a global shutter is realized, there is little noise even at low illumination, sensitivity and saturation charge amount are secured, and it is possible to suppress the occurrence of time-skipping in a moving image.

In addition, in the solid state imaging element disclosed in the PTL 1 described above, the saturation charge amount is made great by using both a CCD-type memory unit and an FD as a charge holding region, and since the CCD-type memory unit is used as a receptacle of the charge which overflowed from the PD during the exposure period, exposure could not be performed when the CCD-type memory unit held a charge. In contrast to this, in the solid state imaging element 11, since a configuration is adopted in which a charge is drained via the drain transistor 29 from the PD 22 during the accumulation period, it is even possible to perform exposure of the PD 22 during the charge holding unit 23 holding a charge. Accordingly, in the solid state imaging element 11, it is possible to image a smooth moving image in which consecutive exposure is demanded, and to avoid a decrease in the sensitivity of the moving image.

In other words, in the solid state imaging element 11, it is possible to perform the electronic shutter in the present frame at concurrent timing to the performance of the rolling read-out in the previous frame by performing accumulation of the charge generated during the accumulation period only by the PD 22.

Figure 8:
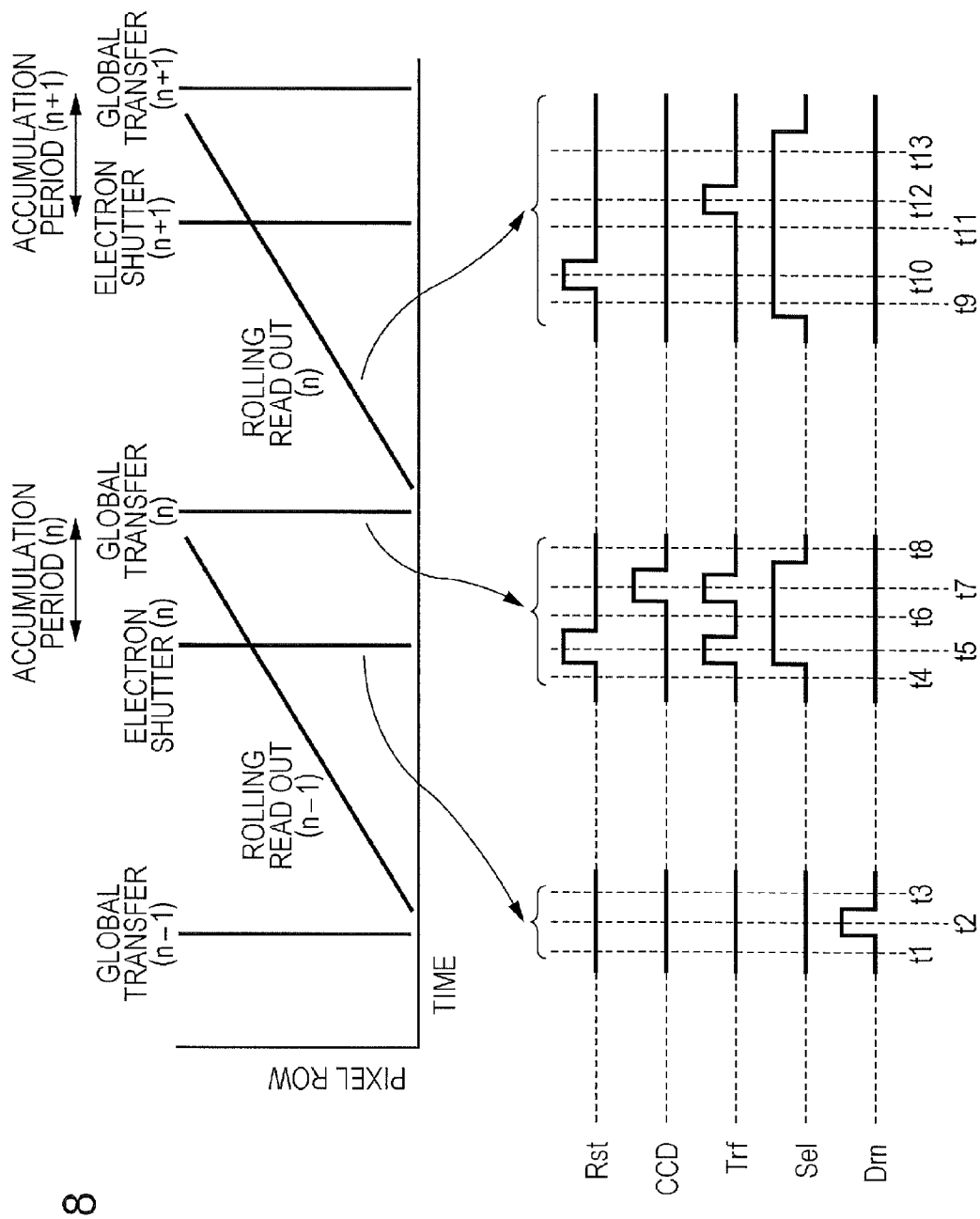
FIG. 8 is a view illustrating the driving when a moving image is imaged using the solid state imaging element.

Referring to FIG. 8, description will be given about being able to perform the electronic shutter in the present frame at concurrent timing to the performance of the rolling read-out in the previous frame.

In FIG. 8, the global transfer (n−1) and the rolling read-out (n−1) are shown as the timing of processing in the n−1th frame, the electronic shutter (n), the global transfer (n), and the rolling read-out (n) are shown as the timing of processing in the nth frame, and the electronic shutter (n+1) and the global transfer (n+1) are shown as the timing of processing in the n+1th frame.

As shown in FIG. 8, the electronic shutter (n) of the nth frame is performed during the period in which the rolling read-out (n−1) of the n−1th frame is being performed. Similarly, the electronic shutter (n+1) of the n+1th frame is performed during the period in which the rolling read-out (n) of the nth frame is being performed.

As described above, the drain of the charge of the electronic shutter and the accumulation of the charge during the accumulation period influence the PD 22, and the transfer of the charge in the rolling read-out does not influence the PD 22. In other words, the elements from the charge holding unit 23 onwards are influenced by the transfer of the charge in the rolling read-out. Therefore, it is possible to perform the electronic shutter and start the accumulation period in the present frame during the period that the rolling read-out in the previous frame is being performed. Furthermore, it is desirable to perform the electronic shutter at the timing where the read-out of the charge from the pixels 21 is switched from row to row, in order to minimize the influence of power supply fluctuation.

By performing the processing at such timing, the accumulation period of the present frame is started during the performance of rolling read-out of the previous frame. As a result, in the solid state imaging element 11, it is possible to obtain a smooth moving image with little time-skipping between frames. In addition, in the solid state imaging element 11, it is possible to obtain an image without distortion due to the global shutter, as well as to obtain a high sensitivity image by miniaturizing the charge holding unit 23 as well as making the PD 22 large.

Furthermore, it is acceptable to perform the electronic shutter during the period in which the global transfer is being performed as long as there are no problems in utilization. For example, when all of the pixels 21 are driven in complete synchronicity, the load on the vertical drive circuit 13 which is a driver increases, therefore, in order to reduce the load, for example, the electronic shutter may be performed by providing a minute time difference between the upper portion and the lower portion of the pixel unit 12. Global shutter may still be realized in this manner even if all of the pixels 21 are not driven in complete synchronicity so long as the time difference between the beginning of the shutter operation for a first pixel 21 and the beginning of the shutter operation for a last pixel 21 in a given frame period is sufficiently small. For example, when the time difference between the beginnings of shuttering a first and last pixel 21 is smaller than 10% of the time it takes to perform the rolling readout operation for all of the pixels 21 in a frame, the shuttering may be deemed a global shutter.

In addition, in the solid state imaging element 11, a pixel common structure, in which a portion of the transistors which configure the pixels 21 may be used in common by a predetermined number of the pixels 21, may be adopted.

Next, the pixels 21 which adopted a pixel common structure will be described with reference to FIG. 9.

Figure 9:
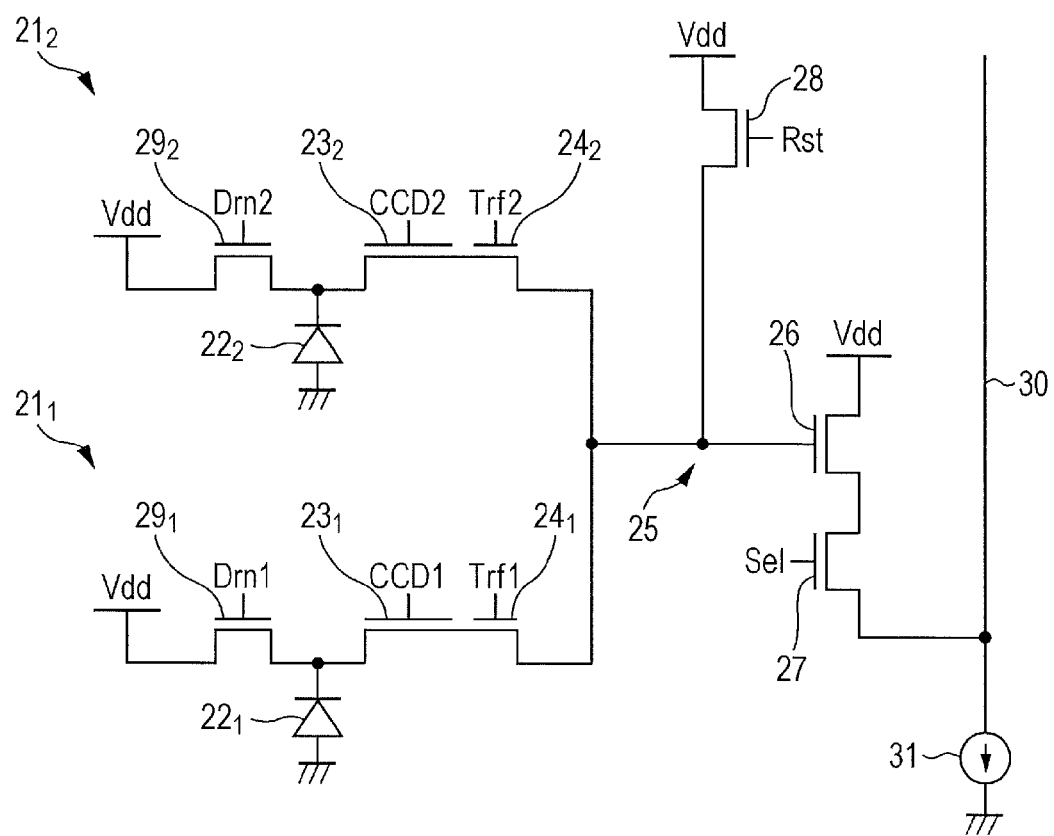
FIG. 9 is a circuit diagram of a pixel in which a pixel common structure is adopted.

In FIG. 9, a pixel common structure in which the FD 25, the amplification transistor 26, the selection transistor 27, and the reset transistor 28 are used in common by the two pixels, the pixel $21_1$ and the pixel $21_2$, is shown. In addition, in FIG. 9, the constant current source 31, which is connected to the vertical signal line 30 in order to read out the pixel signal from the pixels 21, is shown.

The pixel $21_1$ is provided with a PD $22_1$, a charge holding unit $23_1$, a transfer transistor $24_1$, and a drain transistor $29_1$, and the pixel $21_2$ is provided with a PD $22_2$, a charge holding unit $23_2$, a transfer transistor $24_2$, and a drain transistor $29_2$. Furthermore, the FD 25, the amplification transistor 26, the selection transistor 27, and the reset transistor 28 are used in common by the pixel $21_1$ and the pixel $21_2$.

However, in the structure in which the FD 25 is used in common by the pixel $21_1$ and the pixel $21_2$, when the charge generated by the PD $22_1$ and the PD $22_2$ is globally transferred, the charges which overflow the PD $22_1$ and the PD $22_2$ are mixed in the FD 25.

Therefore, in the imaging device with a solid state imaging element 11 which adopts a pixel common structure built in, a global shutter is realized by using a mechanical shutter, and is of a structure which avoids the charge being mixed in the common FD 25.

In FIG. 10, a block diagram is shown of an imaging device which has the solid state imaging element 11, in which a pixel common structure is adopted, built in.

As shown in FIG. 10, the imaging device 101 is configured to include an optical system 102, a mechanical shutter 103, a solid state imaging element 11, a DSP (Digital Signal Processor) 104, a display unit 105, memory 106, a power supply unit 107, an operation unit 108, and a CPU (Central Processing Unit) 109.

The optical system 102 is configured to have a plurality of lenses, condenses the light from a subject (not shown), and forms an image of the subject on the light receiving surface of the solid state imaging element 11 via the mechanical shutter 103. In addition, the optical system 102 adjusts the magnification by driving the lenses according to the control of the CPU 109.

The mechanical shutter 103 is driven to open and close according to the control of the CPU 109, the solid state imaging element 11 is irradiated with light in the state in which the mechanical shutter 103 is open, and the solid state imaging element 11 is shaded from the irradiated light in the state in which the mechanical shutter 103 is closed. In addition, the mechanical shutter 103 may be configured by a simple structure in which the end of the accumulation period may be specified.

The solid state imaging element 11 outputs a pixel signal corresponding to the light irradiated to the light receiving surface thereof to the DSP 104.

The DSP 104 constructs an image based on the pixel signal output from the solid state imaging element 11 and supplies the image to the display unit 105 to display thereon, and to the memory 106 to store thereon. The display unit 105 is configured to include a liquid crystal panel, an organic EL (Electro-Luminescence) panel, or the like, and displays the image constructed by the DSP 104. The memory 106 is configured by non-volatile memory such as flash memory (for example, EEPROM (Electronically Erasable and Programmable Read Only Memory)), and stores the image constructed by the DSP 104.

The power supply unit 107 supplies the electrical power necessary to drive each block which configures the imaging device 101 according to the control of the CPU 109. The operation unit 108 is configured to include a button, a lever, a touch panel, or the like, and supplies an operation signal corresponding to the operation of the user to the CPU 109.

The CPU 109 transmits a control signal to each of the blocks which configures the imaging device 101 and controls the operations of the blocks. For example, after the accumulation period is started by the electronic shutter being driven by the vertical drive circuit 13 in synchronicity with the vertical drive circuit 13 of the solid state imaging element 11, the CPU 109 makes the mechanical shutter 103 perform shielding in relation to the solid state imaging element 11 corresponding to the timing at which the accumulation period ends.

The imaging device 101 is configured in this manner, thereby the mechanical shutter 103 is driven to open and close corresponding to the control of the CPU 109, and the mechanical shutter 103 is closed at the timing where the accumulation period, in which a charge is accumulated in the PD 22 of the solid state imaging element 11, ends. In this manner, in the imaging device 101, when a still image is imaged, a global shutter is realized using the mechanical shutter 103. In addition, mixing of the charges in the FD 25 is also avoided.

Next, the driving when a still image is imaged by the imaging device 101 will be described with reference to FIG. 11.

Figure 11:
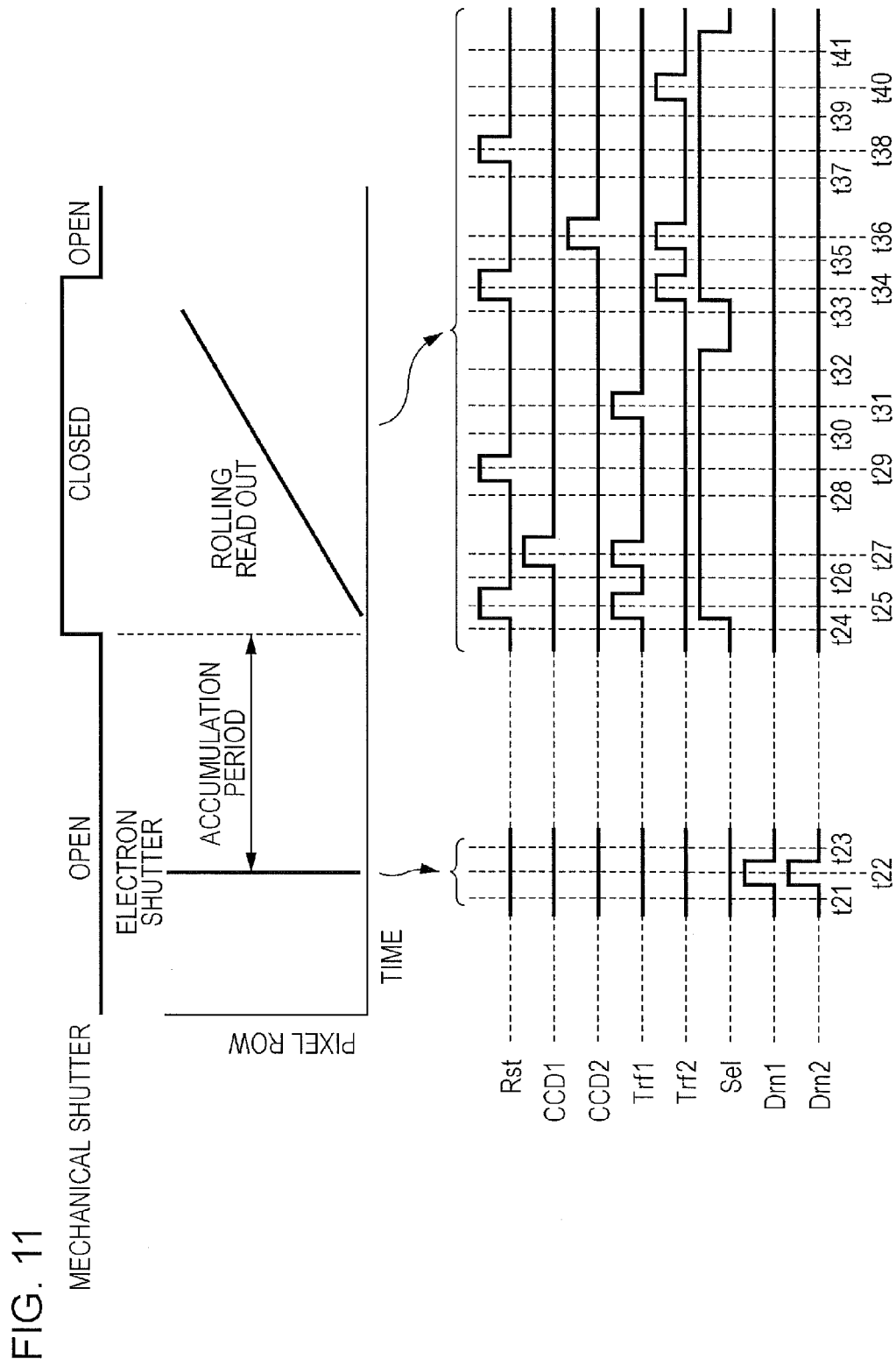
FIG. 11 is a view illustrating the driving when a still image is imaged using the imaging device.

In FIG. 11, the driving timing of each row of the pixels 21, and a timing chart of each signal are shown in the same manner as in FIG. 3.

First, in a state in which the mechanical shutter 103 is open, the electronic shutter operates at the same time in all of the rows of the pixels 21 included in the pixel unit 12, the charge accumulated in the PD $22_1$ and the PD $22_2$ is drained, and the accumulation period, in which the charge is accumulated in the PD $22_1$ and the PD $22_2$, is started. At this time, the potential of the pixel $21_1$ and the pixel $21_2$ between the timing t21 and t23 of FIG. 11 is the same as that between the timing t1 and t3 in FIG. 4.

Next, a global shutter in which the accumulation period is unified in all of the pixels 21 is realized by closing the mechanical shutter 103 at the timing where the accumulation period ends.

Furthermore, the transfer of the charge is performed sequentially in each row of the pixels 21 included in the pixel unit 12, and a rolling read-out is performed. Here, as shown in FIG. 9, in a structure in which the FD 25 is supplied by the two pixels, pixel $21_1$ and pixel $21_2$, the pixel signal is read out in order between the pixel $21_1$ and the pixel $21_2$.

First, the pixel signal is read out from the pixel $21_1$. In other words, at the timing where the selection signal Sel is on, the reset signal Rst and the transfer signal Trt1 become on in a pulse-shape (timing t25), and the charge holding unit $23_1$ and the FD 25 are reset. Next, the transfer signal CCD1 and the transfer signal Trf1 become on in a pulse-shape (timing t27), and in the charge accumulation period, the charge generated by the PD $22_1$ is transferred to the charge holding unit $23_1$ and the FD 25.

Subsequently, a pixel signal of a level corresponding to the charge transferred to the FD 25 is read out (timing t28), and after the reset signal Rst becomes on in a pulse-shape and the FD 25 is reset, the pixel signal of a reset level is read out (timing t30). Furthermore, after the transfer signal Trf1 becomes on in a pulse-shape and the charge accumulated in the charge holding unit $23_1$ is transferred to the FD 25, a pixel signal of a level corresponding to the charge accumulated in the charge holding unit $23_1$ is read out (timing t32). Subsequently, the selection signal Sel becomes off.

Next, the pixel signal is read out from the pixel $21_2$. In other words, at the timing where the selection signal Sel is on, the reset signal Rst and the transfer signal Trf2 become on in a pulse-shape (timing t34), and the charge holding unit $23_2$ and the FD 25 are reset. Subsequently, the transfer signal CCD2 and the transfer signal Trf2 become on in a pulse-shape (timing t36), and in the charge accumulation period, the charge generated by the PD $22_2$ is transferred to the charge holding unit $23_2$ and the FD 25.

Subsequently, a pixel signal of a level corresponding to the charge transferred to the FD 25 is read out (timing t37), and after the reset signal Rst becomes on in a pulse-shape and the FD 25 is reset, the pixel signal of a reset level is read out (timing t39). Furthermore, after the transfer signal Trf2 becomes on in a pulse-shape and the charge accumulated in the charge holding unit $23_2$ is transferred to the FD 25, a pixel signal of a level corresponding to the charge accumulated in the charge holding unit $23_2$ is read out (timing t41). Subsequently, the selection signal Sel becomes off.

In this manner, in a structure in which the FD 25 is supplied by the two pixels, the pixel $21_1$ and the pixel $21_2$, the transfer of the charge from the PD 22 is not the same timing at all of the pixels 21 due to the transfer of the charge and the rolling read-out being performed sequentially for each row of the pixels 21. Therefore, the charge is in a state of being accumulated in the PD 22 until being transferred, however, since the solid state imaging element 11 is shielded by the mechanical shutter 103, an occurrence of charge due to a photoelectric conversion after the accumulation period is prevented.

At this time, the potential of the pixel $21_1$ and the pixel $21_2$ between the timing t24 and t27, and between t33 and t36 of FIG. 11 is the same as that between the timing t4 and 7 in FIG. 5 and FIG. 6. In addition, the potential of the pixel $21_1$ and the pixel $21_2$ between the timing t28 and t32 and between the timing t37 and t41 of FIG. 11 is the same as that between the timing t9 and 13 in FIG. 6 and FIG. 7.

In this manner, the global shutter is realized and a still image may be imaged, even if a pixel common structure is adopted in the solid state imaging element 11. Therefore, in the solid state imaging element 11, in addition to being able to achieve miniaturization due to a pixel common structure, a still image with a global shutter with an increased saturation may be obtained, and a better image may be acquired.

In addition, in the solid state imaging element 11 which adopted a pixel common structure, when imaging a still image, since the operation of transferring the charge is performed for each row of the pixels 21, the pixel signal of a reset level from the pixels 21 may be read out to the column processing circuit 14 at the timing t26 of FIG. 11. Accordingly, for a pixel signal of a high illumination, the difference between the pixel signal of a reset level which is read out at the timing t26, not the difference between the pixel signal of a reset level which is read out at the timing t30, may be used. Therefore, in addition to being able to reduce the reset noise in the pixel signal of a high illumination, since the order of a process of obtaining the difference is the same as that of the pixel signal of a low illumination (reading out the pixel signal of a level corresponding to the charge generated after reading out the pixel signal of a reset level), the configuration of the column processing circuit 14 may be further simplified.

Furthermore, when it is acceptable for the number of pixels of the still image to be small, a read-out operation which performs pixel addition, not reading out the pixel signal from all of the pixels 21, may be adopted.

Incidentally, when a moving image is imaged by the imaging device 101, the mechanical shutter 103 is not used. At present, in the imaging device 101, the solid state imaging element 11 capable of imaging still images of 10 megapixels or more is adopted, however, in contrast, the number of pixels of a moving image is approximately 2 megapixels. Therefore, in the solid state imaging element 11 which adopts a pixel common structure, pixel addition is used to reduce the number of pixels, and a moving image may be imaged.

Next, the driving when a moving image is imaged by the imaging device 101 will be described with reference to FIG. 12.

Figure 12:
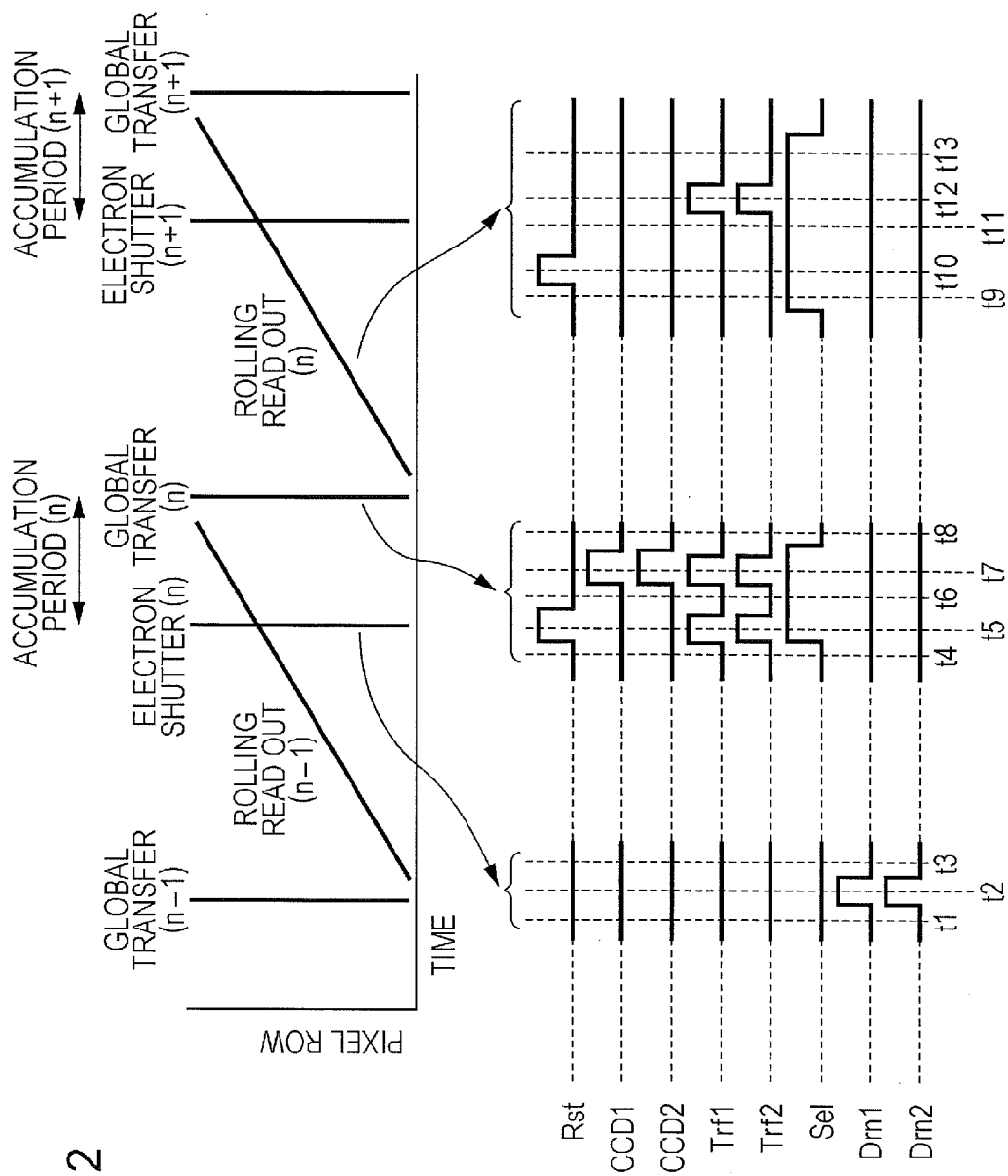
FIG. 12 is a view which illustrates the driving when a moving image is imaged using the imaging device.

In FIG. 12, the driving timing of each row of the pixels 21, and a timing chart of each signal are shown in the same manner as in FIG. 11.

First, the electronic shutters operate at the same time in all of the rows of the pixels 21 included in the pixel unit 12, the charge accumulated in the PD 22 is drained, and an accumulation period, in which the charge is accumulated in the PD $22_1$ and the PD $22_2$, is started. In other words, at the same time in all of the rows of the pixels 21 included in the pixel unit 12, the drain signals Drn1 and Drn2 are on and the charges accumulated in the PD $22_1$ and the PD $22_2$ are drained to the power supply wiring Vdd. Furthermore, from the timing where the drain signals Drn1 and Drn2 are off, the charge starts accumulating in the PD $22_1$ and the PD $22_2$.

Next, the charge accumulation period ends at the same time in all of the rows of the pixels 21 included in the pixel unit 12, and global transfer is performed. In other words, at the timing where the selection signal Sel is on, the reset signal Rst and the transfer signals Trf1 and Trf2 become on in a pulse-shape, and the charge holding units $23_1$ and $23_2$ and the FD 25 are reset. Subsequently, the transfer signals CCD1 and CCD2 and the transfer signals Trf1 and Trf2 become on in a pulse-shape, and in the charge accumulation period, the charges generated by the PD $22_1$ and the PD $22_2$ are transferred to the respective charge holding units $23_1$ and $23_2$, and the selection signal Sel is subsequently off.

In this manner, in the solid state imaging element 11, a global shutter is realized by the fact that the accumulation period is started at the same time (at the same timing) in all of the pixels 21, and, the charges accumulated in the PD $22_1$ and the PD $22_2$ during the accumulation period are transferred at the same time.

Furthermore, the rolling read-out of the pixel signal of a reset level and the pixel signal of a level corresponding to the charges generated by the PD $22_1$ and the PD $22_2$ is performed sequentially for each row of the pixels 21. Here, in the solid state imaging element 11, as the pixel signal of a level corresponding to the charges generated by the PD $22_1$ and the PD $22_2$, the pixel signal of a level corresponding to the charges transferred to the charge holding units $23_1$ and $23_2$ in the global transfer, and the pixel signal of a level corresponding to the charges which overflowed the charge holding units $23_1$ and $23_2$ in the global transfer are transferred to the FD 25 and read out.

In other words, the selection signal Sel is on, a pixel signal of a level corresponding to the charge transferred to the FD 25 in the global transfer is read out, and after the reset signal Rst becomes on in a pulse-shape and the FD 25 is reset, the pixel signal of a reset level is read out. Furthermore, after the transfer signals Trf1 and Trf2 become on in a pulse-shape and the charges accumulated in the charge holding units $23_1$ and $23_2$ are transferred to the FD 25, a pixel signal of a level corresponding to the charge transferred to the charge holding units $23_1$ and $23_2$ in the global transfer is read out. In other words, the pixel signals corresponding to the light receiving amount of the pixel $21_1$ and the pixel $21_2$ are added and read out. Subsequently, the selection signal Sel becomes off.

At this time, the potential of the pixel $21_1$ and the pixel $21_2$ between the timing t1 and t13 of FIG. 12 is the same as that between the timing t1 and t13 in FIG. 4 to FIG. 7.

In this manner, by performing pixel addition, in addition to being able to miniaturize the pixels 21 due to a pixel common structure, a moving image with a global shutter with an increased saturation may be obtained. Furthermore, if a low sensitivity image, or an image having aliasing noise is acceptable, thinning read-out, in which only the pixel signal from one of the pixels 21 of the plurality of common pixels 21 is read out, may be performed without performing the pixel addition.

Here, since the charge generated by the PD $22_1$ and the PD $22_2$ are mixed in the FD 25, the pixel $21_1$ and the pixel $21_2$ of a common structure are selected such that the PD $22_1$ and the PD $22_2$ receive light of the same color.

Figure 13:
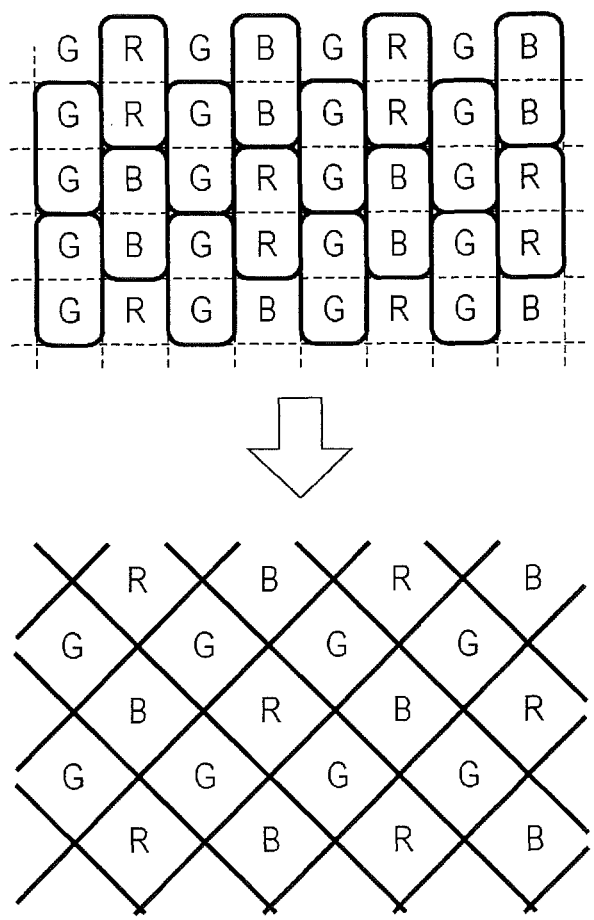
FIG. 13 is a view illustrating the arrangement of the pixels in a solid state imaging element in which a pixel common structure is adopted.

In FIG. 13, an example of the color arrangement in the solid state imaging element 11 in which a pixel common structure is adopted is shown. In FIG. 13, the color arrangement in a two pixel common structure is shown.

In the color arrangement shown in the upper side of FIG. 13, the same color is arranged two at a time in the vertical direction, and the two pixels surrounded by a thick line are of a pixel common structure. Furthermore, when a moving image is imaged, an image of a Bayer arrangement rotated obliquely by 45 degrees is acquired as shown in the lower side of FIG. 13 by performing pixel addition in the two common pixels.

Furthermore, when all of the pixels are read out in a still image, the color arrangement is unique, however, it is possible to perform an operation of expanding the dynamic range in a Bayer arrangement rotated obliquely by 45 degrees by differing the accumulation times of the two common pixels together. According to such a color arrangement, since it is an oblique arrangement, the color arrangement may easily be made into a square lattice of two times the number of pixels in the signal processing. In other words, it is possible to restore to the original number of pixels simply. In addition, when the solid state imaging element 11 of the color arrangement shown in FIG. 13 is configured to be implemented rotated obliquely by 45 degrees, an image of a Bayer arrangement may be acquired when a moving image is imaged, and when a still image with an expanded dynamic range is imaged.

Figure 14:
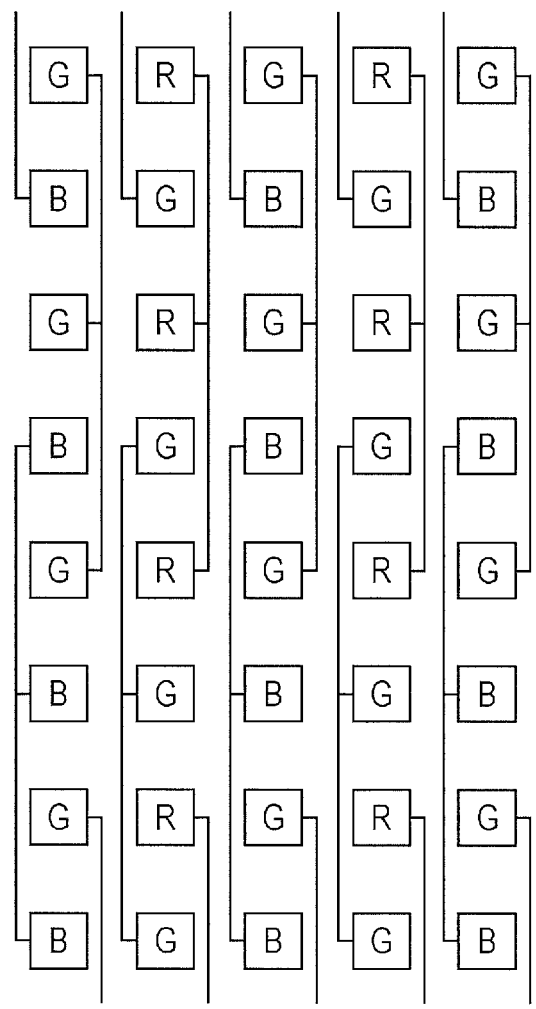
FIG. 14 is a view illustrating the arrangement of the pixels in a solid state imaging element in which a pixel common structure is adopted.

In FIG. 14, an example of the color arrangement in the solid state imaging element 11 in which a pixel common structure is adopted is shown. In FIG. 14, the color arrangement in a three pixel common structure is shown.

In the color arrangement shown in FIG. 14, the three pixels connected by wiring are the common unit. In this manner, in a Bayer arrangement, three pixels of the same color may be used alternately in common vertically. In addition, by combining the pixel addition in the three common pixels, and the pixel addition performed on three columns in the column direction in the column processing circuit 14 and the like, an image of a Bayer arrangement formed from ⅑ of the number of pixels of the pixels 21 included in the solid state imaging element 11 can be reconstructed. Accordingly, for example, when the number of pixels of the solid state imaging element 11 is 18 megapixels or more, an HD (High Definition) moving image of 2 megapixels or more may be imaged.

Furthermore, in a configuration which adopts a pixel common structure, a structure in which the charge is temporarily held only in the FD 25 without providing the charge holding unit 23 may be adopted.

Furthermore, the solid state imaging element 11 may be used in applications where an image is imaged using a detectable predetermined physical amount, for example, an incidence, a pressure distribution, or the like of an infrared ray, an X-ray, a particle, or the like, as well as for imaging images using visible light. In addition, as the solid state imaging element 11, as well as end products such as the imaging device 101 (a so-called digital still camera), configurations in which the solid state imaging element 11 is a module for embedding into end products are included.

Furthermore, the present technology may also adopt the following configurations.

(1) A solid state imaging element, comprising:
a drive circuit; and
a pixel unit including pixels arranged in a matrix form,
wherein a given one of the pixels includes:
a photoelectric conversion element configured to convert light incident thereupon into a charge and to accumulate the charge,
a charge holding unit connected to the photoelectric conversion element, and
a floating diffusion region, and
wherein the drive circuit is configured to perform a transfer operation for the given one of the pixels comprising causing the charge holding unit to receive and hold a first portion of the charge accumulated in the photoelectric conversion element and concurrently causing the floating diffusion region to receive and hold a second portion of the charge accumulated in the photoelectric conversion element.

(2) The solid state imaging element as described in (1), wherein the drive circuit is configured to, after performing the transfer operation, read out a data signal corresponding to the magnitude of the second portion of the charge accumulated in the photoelectric conversion element and subsequently to read out a data signal corresponding to the magnitude of the first portion of the charge accumulated in the photoelectric conversion element.

(3) The solid state imaging element as described in (2), wherein the drive circuit is configured to, after reading out the data signal corresponding to the magnitude of the second portion of the charge accumulated in the photoelectric conversion element and before reading out the data signal corresponding to the magnitude of the first portion of the charge accumulated in the photoelectric conversion element:
reset the floating diffusion region;
read out a data signal corresponding to a reset level of the floating diffusion region; and
perform a secondary transfer operation comprising causing the first portion of the charge accumulated in the photoelectric conversion element, which is held in the charge holding unit, to be transferred to the floating diffusion region.

(4) The solid state imaging element as described in (3),
wherein the given one of the pixels further comprises:
a reset transistor connected to the floating diffusion region and to a reset potential and that is configured to conduct when a reset signal is applied thereto; and
a selection transistor configured to, when a selection signal is applied thereto, output a data signal to the drive circuit, the data signal being based on the magnitude of a charge held in the floating diffusion region;
wherein the drive circuit is configured to:
read out the data signal corresponding to the magnitude of the second portion of the charge accumulated in the photoelectric conversion element by applying the selection signal to the selection transistor when the second portion of the charge accumulated in the photoelectric conversion element is held in the floating diffusion region,
reset the floating diffusion region by applying the reset signal to the reset transistor,
read out the data signal corresponding to a reset level of the floating diffusion region by applying the selection signal to the selection transistor after resetting the floating diffusion region, and
read out the data signal corresponding to the magnitude of the first portion of the charge accumulated in the photoelectric conversion element by applying the selection signal to the selection transistor when the first portion of the charge accumulated in the photoelectric conversion element is held in the floating diffusion region.

(5) The solid state imaging element as described in (1),
wherein each of the pixels includes a photoelectric conversion element configured to convert light incident thereupon into a charge and to accumulate the charge, and
wherein the drive circuit is configured to perform a global shutter operation comprising:
beginning respective charge accumulation periods for each of the pixels at substantially the same time by resetting the photoelectric conversion element of each of the pixels at substantially the same time, and
ending the respective accumulation periods for each of the pixels at substantially the same time.

(6) The solid state imaging element as described in (5),
wherein each of the pixels includes
a charge holding unit connected to the photoelectric conversion element thereof, and
a floating diffusion region, and
wherein the drive circuit is configured to end the respective accumulation periods for the pixels at substantially the same time by performing the transfer operation for each of the pixels at substantially the same time.

(7) The solid state imaging element as described in (6),
wherein the drive circuit is configured to perform a rolling readout operation comprising reading out, from each of the pixels, respective data signals corresponding to the respective charges accumulated in the photoelectric conversion elements of the pixels, and
wherein the drive circuit is configured to start the global shutter operation for an (n+1)-th imaging frame while the rolling readout operation for an n-th imaging frame is being performed.

(8) The solid state imaging element as described in (1),
wherein the given one of the pixels includes a drain transistor connected to the photoelectric conversion element and to a drain potential,
wherein the drive circuit is configured to reset the photoelectric conversion element by causing the drain transistor to be in a conducting state for a pulsed period, and
wherein a magnitude of a potential barrier between the drain transistor when in a non-conducting state and the photoelectric conversion element is smaller than a magnitude of a potential barrier between the charge holding unit and the photoelectric conversion element.

(9) The solid state imaging element as described in (1),
wherein each of the pixels includes:
a photoelectric conversion element configured to convert light incident thereupon into a charge and to accumulate the charge,
a charge holding unit connected to the photoelectric conversion element thereof, and
a floating diffusion region,
wherein the pixels are arranged in groups of N pixels, where N is an integer, and wherein those pixels that are included in a same one of the groups share one floating diffusion region in common, the one floating diffusion region constituting the respective floating diffusion regions included in each of those pixels that share the one floating diffusion in common.

(10)

The solid state imaging element as described in (9), wherein the drive circuit is configured to perform a global shutter operation comprising:

beginning respective charge accumulation periods for each of the pixels at substantially the same time by resetting the photoelectric conversion element of each of the pixels at substantially the same time, and ending the respective accumulation periods for each of the pixels at substantially the same time.

(11)

The solid state imaging element as described in (10), wherein the drive circuit is configured to end the respective accumulation periods for the pixels at substantially the same time by performing the transfer operation for each of the pixels at substantially the same time.

(12)

The solid state imaging element as described in (11), wherein the drive circuit is configured to perform a rolling readout operation comprising reading out, from each of the pixels, respective data signals corresponding to the respective charges accumulated in the photoelectric conversion elements of the pixels, and wherein the drive circuit is configured to start the global shutter operation for an (n+1)-th imaging frame while the rolling readout operation for an n-th imaging frame is being performed.

(13)

The solid state imaging element as described in (10), wherein the drive circuit is configured to end the respective accumulation periods for the pixels at substantially the same time by driving a mechanical shutter.

(14)

The solid state imaging element as described in (1), wherein a charge holding capacity of the charge holding unit is less than a charge holding capacity of the photoelectric conversion element.

(15)

An electronic imaging apparatus comprising the solid state imaging element as described in (1).

(16)

A method of operating a solid state imaging element that includes pixels arranged in a matrix form, wherein a given one of the pixels includes a photoelectric conversion element configured to convert light incident thereupon into a charge and to accumulate the charge, a charge holding unit connected to the photoelectric conversion element, and a floating diffusion region, the method comprising:

performing a transfer operation for the given one of the pixels of causing the charge holding unit to receive and hold a first portion of the charge accumulated in the photoelectric conversion element and concurrently causing the floating diffusion region to receive and hold a second portion of the charge accumulated in the photoelectric conversion element.

(17)

The method of operating a solid state imaging element as described in (16), the method further comprising, after performing the transfer operation for the given one of the pixels, successively:

reading out a data signal corresponding to the magnitude of the second portion of the charge accumulated in the photoelectric conversion element;

resetting the floating diffusion region;

reading out a data signal corresponding to a reset level of the floating diffusion region;

performing a secondary transfer operation comprising causing the first portion of the charge accumulated in the photoelectric conversion element that is held in the charge holding unit to be transferred to the floating diffusion region; and reading out a data signal corresponding to the magnitude of the first portion of the charge accumulated in the photoelectric conversion element.

(18)

The method of operating a solid state imaging element as described in (16), wherein each of the pixels includes a photoelectric conversion element configured to convert light incident thereupon into a charge and to accumulate the charge, the method further comprising performing a global shutter operation comprising:

beginning respective charge accumulation periods for each of the pixels at substantially the same time by resetting the photoelectric conversion element of each of the pixels at substantially the same time, and ending the respective accumulation periods for each of the pixels at substantially the same time.

(19)

The method of operating a solid state imaging element as described in (18), wherein each of the pixels includes a floating diffusion region and a charge holding unit connected to the photoelectric conversion element thereof, the method further comprising:

ending the respective accumulation periods for the pixels at substantially the same time by performing the transfer operation for each of the pixels at substantially the same time.

(20)

The method of operating a solid state imaging element as described in (19), the method further comprising:

performing a rolling readout operation comprising reading out, from each of the pixels, respective data signals corresponding to the respective charges accumulated in the photoelectric conversion elements of the pixels, and starting the global shutter operation for an (n+1)-th imaging frame while the rolling readout operation for an n-th imaging frame is being performed.

(21)

A solid state imaging element including a pixel unit in which pixels, each of which has a charge generation unit which generates and accumulates a charge corresponding to a predetermined physical amount, a drain unit which drains the charge accumulated in the charge generation unit, a holding unit which holds the charge transferred from the charge generation unit, and a conversion unit which converts the charge generated in the charge generation unit into a pixel signal of a level corresponding to the charge, are arranged two dimensionally in a matrix;

a drive unit, in which an accumulation period in which the charge accumulated in the charge generation unit is to be output as the pixel signal and drained to the drain unit at approximately same timing in relation to all of the pixels which are arranged in the pixel unit is started, the accumulation period is ended at approximately same timing in relation to all of the pixels which are arranged in the pixel unit, and which drives to output the pixel signal for each row of the pixels which are arranged in the pixel unit;

in which, when the charge generated in the charge generation unit is transferred to the holding unit, a portion of the charge which exceeds a capacity of the holding unit is transferred to the conversion unit, and the charge generated in the charge generation unit is held by the holding unit and the conversion unit.

(22)

The solid state imaging element described in the above (21), in which the drive unit ends the accumulation period by performing transfer of the charge from the charge generation unit to the holding unit at approximately same timing in relation to all of the pixels arranged in the pixel unit.

(23)

The solid state imaging element described in the above (21) or (22), in which the drive unit drives to output a pixel signal of a level corresponding to the charge which exceeds a capacity of the holding unit, is transferred to the conversion unit and accumulated in the conversion unit, output a pixel signal of a reset level in a state in which the charge accumulated in the conversion unit is drained and the conversion unit is reset, and transfer the charge held in the holding unit to the conversion unit and outputs a pixel signal of a level corresponding to the charge accumulated in the conversion unit.

(24)

The solid state imaging element described in any one of the above (21) to (23), in which a potential barrier of a drain unit side of the charge generation unit is set lower than the potential barrier of a holding unit side of the charge generation unit, such that a charge is drained from the charge generation unit to the drain unit when a charge which exceeds an accumulation capacity of the charge generation unit is generated during the accumulation period.

(25)

The solid state imaging element described in any one of the above (21) to (24), in which, in the drive unit, when an image constructed from the pixel signal is acquired continuously, during a period in which driving of outputting the pixel signal for each row of the pixels in a frame before a present frame is being performed, driving of starting the accumulation period in the present frame is performed.

(26)

The solid state imaging element described in any one of the above (21) to (25), in which a pixel common structure in which the conversion unit is used in common by a predetermined number of the pixels is adopted.

(27)

A driving method of solid state imaging element having a pixel unit in which pixels, each of which has a charge generation unit which generates and accumulates a charge corresponding to a predetermined physical amount, a drain unit which drains the charge accumulated in the charge generation unit, a holding unit which holds the charge transferred from the charge generation unit, and a conversion unit which converts the charge generated in the charge generation unit into a pixel signal of a level corresponding to the charge, are arranged two dimensionally in a matrix, the driving method comprising steps of:

starting an accumulation period in which the charge accumulated in the charge generation unit is to be output as the pixel signal and drained to the drain unit at approximately same timing in relation to all of the pixels which are arranged in the pixel unit;

ending the accumulation period at approximately same timing in relation to all of the pixels which are arranged in the pixel unit; and outputting the pixel signal for each row of the pixels which are arranged in the pixel unit, wherein, when the charge generated in the charge generation unit is transferred to the holding unit, a portion of the charge which exceeds a capacity of the holding unit is transferred to the conversion unit, and the charge generated in the charge generation unit is held by the holding unit and the conversion unit.

(28)

An electronic apparatus comprising:

a solid state imaging element including a pixel unit in which pixels, each of which has a charge generation unit which generates and accumulates a charge corresponding to a predetermined physical amount, a drain unit which drains the charge accumulated in the charge generation unit, a holding unit which holds the charge transferred from the charge generation unit, and a conversion unit which converts the charge generated in the charge generation unit into a pixel signal of a level corresponding to the charge, are arranged two dimensionally in a matrix; and a drive unit, in which an accumulation period in which the charge accumulated in the charge generation unit is to be output as the pixel signal and drained to the drain unit at approximately same timing in relation to all of the pixels which are arranged in the pixel unit is started, the accumulation period is ended at approximately same timing in relation to all of the pixels which are arranged in the pixel unit, and which drives to output the pixel signal for each row of the pixels which are arranged in the pixel unit;

wherein, when the charge generated in the charge generation unit is transferred to the holding unit, a portion of the charge which exceeds a capacity of the holding unit is transferred to the conversion unit, and the charge generated in the charge generation unit is held by the holding unit and the conversion unit.

(29)

The electronic apparatus described in (28), wherein a pixel common structure in which the conversion unit is used in common by a predetermined number of the pixels is adopted;

a shielding mechanism which switches irradiation and shielding of light in relation to the pixel unit is further provided; and the accumulation period is ended by performing shielding in relation to the pixel unit using the shielding mechanism when a still image is acquired according to an image constructed from the pixel signal.

(30)

The electronic apparatus described in (28), wherein a pixel common structure in which the conversion unit is used in common by a predetermined number of the pixels is adopted; and the accumulation period is ended by performing transfer of the charge from the charge generation unit to the holding unit at approximately same timing in relation to all of the pixels arranged in the pixel unit when an image constructed from the pixel signal is acquired continuously and a moving image is imaged.

In addition, the present embodiments are not limited by the embodiments described above, and various types of modifications carried out in a range not departing from the gist of the present disclosure are possible.

REFERENCE SIGNS LIST

11 solid state imaging element
12 pixel unit 13 vertical drive circuit
14 column processing circuit
15 output circuit
16 control circuit
21 pixel
22 PD
23 charge holding unit
24 transfer transistor
25 FD
26 amplification transistor
27 selection transistor
28 reset transistor
29 drain transistor
30 vertical signal line
31 constant current source
101 imaging device
102 optical system
103 mechanical shutter
104 DSP
105 display unit
106 memory
107 power supply unit
108 operation unit
109 CPU

The invention claimed is:

1. A solid state imaging element, comprising:
a drive circuit; and
a pixel unit, wherein the pixel unit comprises a plurality of pixels arranged in a matrix form, wherein each pixel of the plurality of the pixels includes:
   a photoelectric conversion element configured to convert light incident thereupon into a charge and to accumulate the charge;
   a charge holding unit connected to the photoelectric conversion element; and
   a floating diffusion region connected to the charge holding unit,
wherein the drive circuit is configured to:
   perform a first transfer operation for each pixel of the plurality of pixels, wherein the first transfer operation causes the charge holding unit to receive and hold a first portion of the charge accumulated in the photoelectric conversion element and concurrently causes the floating diffusion region to receive and hold a second portion of the charge accumulated in the photoelectric conversion element;
   perform a global shutter operation that comprises:
      begin respective charge accumulation periods for each pixel of the plurality of pixels at substantially same time by reset of the photoelectric conversion element of each pixel of the plurality of pixels at substantially the same time, and
      end the respective accumulation periods for each pixel of the plurality of pixels at substantially the same time based on performance of the first transfer operation for each pixel of the plurality of pixels at substantially the same time;
   perform a rolling readout operation that comprises read out, from each pixel of the plurality of pixels, respective data signals that correspond to the respective charges accumulated in the photoelectric conversion elements of the plurality of pixels; and
   start the global shutter operation for an (n+1)-th imaging frame while the rolling readout operation for an n-th imaging frame is being performed.

2. The solid state imaging element of claim 1, wherein the drive circuit is further configured to, after performance of the first transfer operation, read out a first data signal corresponding to a magnitude of the second portion of the charge accumulated in the photoelectric conversion element and subsequently read out a second data signal corresponding to a magnitude of the first portion of the charge accumulated in the photoelectric conversion element.

3. The solid state imaging element of claim 2, wherein the drive circuit is further configured to, after read out of the first data signal corresponding to the magnitude of the second portion of the charge accumulated in the photoelectric conversion element and before read out of the second data signal corresponding to the magnitude of the first portion of the charge accumulated in the photoelectric conversion element:
   reset the floating diffusion region;
   read out a third data signal corresponding to a reset level of the floating diffusion region; and
   perform a second transfer operation that causes the first portion of the charge accumulated in the photoelectric conversion element, which is held in the charge holding unit, to be transferred to the floating diffusion region.

4. The solid state imaging element of claim 3, wherein the each of the plurality of pixels further comprises:
   a reset transistor connected to the floating diffusion region and to a reset potential, wherein the reset transistor is configured to conduct when a reset signal is applied thereto; and
   a selection transistor configured to output a fourth data signal to the drive circuit based on an application of a selection signal to the selection transistor, wherein the fourth data signal is based on a magnitude of a charge held in the floating diffusion region,
   wherein the drive circuit is further configured to:
      read out the first data signal corresponding to the magnitude of the second portion of the charge accumulated in the photoelectric conversion element by the application of the selection signal to the selection transistor based on the second portion of the charge accumulated in the photoelectric conversion element beinq held in the floating diffusion region;
      reset the floating diffusion region by application of the reset signal to the reset transistor;
      read out the third data signal corresponding to the reset level of the floating diffusion region by application of the selection signal to the selection transistor after reset of the floating diffusion region; and
      read out the second data signal corresponding to the magnitude of the first portion of the charge accumulated in the photoelectric conversion element by application of the selection signal to the selection transistor based on the first portion of the charge accumulated in the photoelectric conversion element being held in the floating diffusion region.

5. The solid state imaging element of claim 1,
   wherein the each pixel of the plurality of pixels includes a drain transistor connected to the photoelectric conversion element and to a drain potential,
   wherein the drive circuit is further configured to reset the photoelectric conversion element based on the drain transistor being in a conducting state for a pulsed period, and
   wherein a magnitude of a first potential barrier between the drain transistor in a non-conducting state and the photoelectric conversion element is smaller than a magnitude of a second potential barrier between the charge holding unit and the photoelectric conversion element.

6. The solid state imaging element of claim 1,
wherein the plurality of pixels are arranged in groups of N pixels, where N is an integer, and
wherein pixels that are included in a same group of the groups share one floating diffusion region in common, wherein the one floating diffusion region constitute respective floating diffusion regions included in each of the pixels that share the one floating diffusion in common.

7. A solid state imaging element, comprising:
a drive circuit; and
a pixel unit, wherein the pixel unit comprises a plurality of pixels arranged in a matrix form, wherein each pixel of the plurality of the pixels includes:
   a photoelectric conversion element configured to convert light incident thereupon into a charge and to accumulate the charge;
   a charge holding unit connected to the photoelectric conversion element; and
   a floating diffusion region connected to the charge holding unit, wherein the plurality of pixels are arranged in groups of N pixels, where N is an integer, and
wherein pixels that are included in a same group of the groups share one floating diffusion region in common, wherein the one floating diffusion region constitute respective floating diffusion regions included in each of the pixels that share the one floating diffusion in common,
wherein the drive circuit is configured to:
   perform a transfer operation for each pixel of the plurality of pixels, wherein the transfer operation causes the charge holding unit to receive and hold a first portion of the charge accumulated in the photoelectric conversion element and concurrently causes the floating diffusion region to receive and hold a second portion of the charge accumulated in the photoelectric conversion element;
   perform a global shutter operation that comprises:
      begin respective charge accumulation periods for each pixel of the plurality of pixels at substantially same time by reset of the photoelectric conversion element of each pixel of the plurality of pixels at substantially the same time, and
      end the respective accumulation periods for each pixel of the plurality of pixels at substantially the same time based on performance of the transfer operation for each pixel of the plurality of pixels at substantially the same time;
   perform a rolling readout operation that comprises read out, from each pixel of the plurality of pixels, respective data signals corresponding to the respective charges accumulated in the photoelectric conversion elements of the plurality pixels; and
   start the global shutter operation for an (n+1)-th imaging frame while the rolling readout operation for an n-th imaging frame is being performed.

8. The solid state imaging element of claim 7, wherein the drive circuit is further configured to end the respective accumulation periods for each pixel of the plurality of pixels at substantially the same time based on driving of a mechanical shutter.

9. The solid state imaging element of claim 1, wherein a charge holding capacity of the charge holding unit is less than a charge holding capacity of the photoelectric conversion element.

10. An electronic imaging apparatus, comprising:
a solid state imaging element, wherein the solid state imaging element comprises:
   a drive circuit; and
   a pixel unit, wherein the pixel unit comprises a plurality of pixels arranged in a matrix form, wherein each pixel of the plurality of the pixels includes:
      a photoelectric conversion element configured to convert light incident thereupon into a charge and to accumulate the charge;
      a charge holding unit connected to the photoelectric conversion element; and
      a floating diffusion region connected to the charge holding unit, wherein the drive circuit is configured to:
   perform a transfer operation for each pixel of the plurality of pixels, wherein the transfer operation causes the charge holding unit to receive and hold a first portion of the charge accumulated in the photoelectric conversion element and concurrently causes the floating diffusion region to receive and hold a second portion of the charge accumulated in the photoelectric conversion element;
   perform a global shutter operation that comprises:
      begin respective charge accumulation periods for each pixel of the plurality of pixels at substantially same time by reset of the photoelectric conversion element of each pixel of the plurality of pixels at substantially the same time, and
      end the respective accumulation periods for each pixel of the plurality of pixels at substantially the same time based on performance of the transfer operation for each pixel of the plurality of pixels at substantially the same time;
   perform a rolling readout operation that comprises read out, from each pixel of the plurality of pixels, respective data signals that correspond to the respective charges accumulated in the photoelectric conversion elements of the plurality of pixels; and
   start the global shutter operation for an (n+1)-th imaging frame while the rolling readout operation for an n-th imaging frame is being performed.

11. A method of operating a solid state imaging element, comprising:
performing a first transfer operation for each pixel of a plurality of pixels of the solid state imaging element, wherein the each pixel of the plurality of pixels comprises:
   a photoelectric conversion element configured to convert light incident thereupon into a charge and to accumulate the charge;
   a charge holding unit connected to the photoelectric conversion element; and
   a floating diffusion region connected to the charge holding unit,
wherein the first transfer operation causes the charge holding unit to receive and hold a first portion of the charge accumulated in the photoelectric conversion element and concurrently causes the floating diffusion region to receive and hold a second portion of the charge accumulated in the photoelectric conversion element;

performing a global shutter operation comprising:
    beginning respective charge accumulation periods for each pixel of the plurality of pixels at substantially the same time by resetting the photoelectric conversion element of each pixel of the plurality of pixels at substantially a same time, and
    ending the respective accumulation periods for each pixel of the plurality of pixels at substantially the same time by performing the first transfer operation for each pixel of the plurality of pixels at substantially the same time;

performing a rolling readout operation comprising reading out, from each pixel of the plurality of pixels, respective data signals corresponding to the respective charges accumulated in the photoelectric conversion elements of the pixels; and starting the global shutter operation for an (n+1)-th imaging frame while the rolling readout operation for an n-th imaging frame is being performed.

12. The method of claim 11, further comprising:
after performing the first transfer operation for the given one of the pixels, successively:
    reading out a first data signal corresponding to a magnitude of the second portion of the charge accumulated in the photoelectric conversion element;
    resetting the floating diffusion region;
    reading out a second data signal corresponding to a reset level of the floating diffusion region;
    performing a second transfer operation that causes the first portion of the charge accumulated in the photoelectric conversion element that is held in the charge holding unit to be transferred to the floating diffusion region; and
    reading out a third data signal corresponding to a magnitude of the first portion of the charge accumulated in the photoelectric conversion element.

13. A solid state imaging element, comprising:
a drive circuit; and
a pixel unit, wherein the pixel unit comprises a plurality of pixels arranged in a matrix form, wherein each pixel of the plurality of the pixels includes:
    a photoelectric conversion element configured to convert light incident thereupon into a charge and to accumulate the charge;
    a charge holding unit connected to the photoelectric conversion element;
    a floating diffusion region connected to the charge holding unit; and
    a drain transistor connected to the photoelectric conversion element and to a drain potential,
wherein the drive circuit is configured to:
    perform a first transfer operation for each pixel of the plurality of pixels, wherein the first transfer operation causes the charge holding unit to receive and hold a first portion of the charge accumulated in the photoelectric conversion element and concurrently causes the floating diffusion region to receive and hold a second portion of the charge accumulated in the photoelectric conversion element; and
    reset the photoelectric conversion element based on the drain transistor being in a conducting state for a pulsed period, and
wherein a magnitude of a first potential barrier between the drain transistor in a non-conducting state and the photoelectric conversion element is smaller than a magnitude of a second potential barrier between the charge holding unit and the photoelectric conversion element.

\* \* \* \* \*